United States Patent [19]

Yasutomi et al.

[11] Patent Number: 5,736,198
[45] Date of Patent: Apr. 7, 1998

[54] SELF-RECOVERABLE COVERING MATERIAL AND METHOD FOR FABRICATING THE SAME

[75] Inventors: Yoshiyuki Yasutomi, Mito; Shigeru Kikuchi, Tokai-mura; Yukio Saito, Hitachi; Mitsuo Nakagawa, Mito; Motoyuki Miyata, Hitachi, all of Japan

[73] Assignee: Hitachi, Ltd., Tokyo, Japan

[21] Appl. No.: 557,960

[22] Filed: Nov. 13, 1995

Related U.S. Application Data

[62] Division of Ser. No. 309,149, Sep. 20, 1994, abandoned.

[30] Foreign Application Priority Data

Sep. 20, 1993 [JP] Japan ................... 5-255197

[51] Int. Cl.$^6$ ........................................ B05D 1/36
[52] U.S. Cl. ................. 427/419.7; 427/140; 427/142; 427/419.2; 427/419.3
[58] Field of Search ........................... 427/140, 142, 427/419.2, 419.3, 419.7

[56] References Cited

U.S. PATENT DOCUMENTS

| | | | |
|---|---|---|---|
| 4,399,168 | 8/1983 | Kullander et al. | 427/419.2 |
| 5,035,923 | 7/1991 | Sarin | 427/419.2 |
| 5,290,354 | 3/1994 | Haluska | 427/419.2 |
| 5,338,577 | 8/1994 | Burdette | 427/419.2 |

*Primary Examiner*—Janyce Bell
*Attorney, Agent, or Firm*—Bardehle, Pagenberg, Dost, Altenburg, Frohwitter, Geissler & Partners

[57] ABSTRACT

The surface of a member formed of at least one kind of ceramics, metals and C/C composites, is covered with an outermost surface oxide covering layer having a stability against the environment in the atmospheric air at 1500° C.; and a self-recoverable layer as an intermediate layer formed between the outermost surface oxide covering layer and the surface of the member. The self-recoverable layer has an oxidizing rate greater than that of the outermost surface covering layer for recovering cracks generated on the outermost surface covering layer, and a compound produced by the self-recoverable layer has the same phase as in the outermost surface covering layer. To achieve the optimum self-recovering function at high temperatures, the outermost surface oxide covering layer may be made of a stable oxide having a vapor pressure of $1 \times 10^{-4}/m^2$ or less in the atmospheric air at 1500° C., and the oxidized product material from the self-recoverable layer contains an oxide having the same composition as that of the outermost surface oxide covering layer.

20 Claims, 6 Drawing Sheets

ENLARGEMENT

MEMBER ($Si_3N_4$)

OUTERMOST SURFACE COATED LAYER (SIALON)

SELF-RECOVERABLE LAYER ($AlB_2$, $NbB_2$)

SELF-RECOVERABLE LAYER

LIFE MEASURING CIRCUIT

LIFE DIAGNOSTIC SYSTEM

SELF-RECOVERABLE COVERING MATERIAL AND METHOD FOR FABRICATING THE SAME

This is a division of patent application Ser. No. 08/309,149, filed Sep. 20, 1994, now abandoned.

BACKGROUND OF THE INVENTION

The present invention relates to a process and composition of matter capable of recovering cracks generated in mechanical structural components.

When metals, carbon/carbon-fiber composites (hereinafter, referred to as "C/C composite") and non-oxide ceramics are used in high temperature oxidizing atmospheres, the surfaces thereof are oxidized. To prevent the oxidization, the surfaces of the above materials are covered with isolating layers having protective materials therein (hereafter sometimes referred to as "PMs", for example, zirconium dioxide). For example, a method of covering zirconium dioxide as an isolating layer on the surface of a metal member is disclosed in Unexamined Japanese Patent Publication Nos. SHO 55-28351 and SHO 58-87273. A method of covering a carbon member with zirconium dioxide as an isolating material is disclosed in Unexamined Japanese Patent Publication No. SHO 58-125679; and a method of covering a silicon nitride member with zirconium dioxide as an isolating layer is disclosed in Examined Japanese Patent Publication No. HEI 5-8152. Further, it is known to cover a cutting tool with a boride and then with alumina for increasing the adhesiveness of the covering.

In non-oxide ceramics, it is also known that they are heated in the atmospheric air at high temperatures to recover voids and cracks generated on the surface.

The above-described references, however, do not examine the reliability under the actual service environment. For example, if a base material is covered with an oxide, such as zirconium dioxide, at the time when the covering layer is cracked, due to its inherently brittle nature, the base material, having a poor resistance to an environmental reactive material (here, oxygen), is exposed and is rapidly oxidized. The base material is oxidized by the generation of cracks, resulting in reduced mechanical strength.

Accordingly, there is a need for an isolating layer which when used will resist reaction of a base material with an environmentally reactive material (hereafter sometimes referred to as "ERM") when the isolating layer is cracked. An object of the present invention, therefore, is to provide a self-recoverable isolating layer having a reactive material (hereafter sometimes referred to as an "RM") which, when exposed to an environmental reactive material ("ERM") reacts with the ERM to recover cracks generated on an outermost surface of the isolating layer.

SUMMARY OF THE INVENTION

To achieve the above object, according to an embodiment of the present invention, the surface of a member formed of a base material (for example: ceramics, metals and/or C/C composites) is covered with an isolating layer having a reactive material therein, wherein the reactive material reacts upon exposure to the environmental reactive material to form a protective material.

According to a more specific embodiment, the isolating layer comprises a reactive material and a protective material, distributed such that there is more protective material near the environmental reactive material and more reactive material near the base material. According to still a more specific embodiment, the isolating layer comprises two distinct layers, wherein the layer closest to the environmental reactive material comprises a protective material and the layer closest to the base material comprises a reactive material.

In a more specific embodiment of the present invention, the surface of a member formed of at least one kind of ceramics, metals and C/C composites, is covered with an outermost surface oxide protective layer having a stability against the environment in the atmospheric air at 1500° C., and a self-recoverable layer of reactive material formed between the outermost surface oxide covering layer and the surface of the member. According to one such embodiment, the self-recoverable layer has an oxidizing rate greater than that of the outermost surface covering layer for recovering cracks generated on the outermost surface covering layer, and a compound produced by the self-recoverable layer has the same phase as in the outermost surface covering layer. To achieve the optimum self-recovering function at high temperatures in one such embodiment, the outermost surface oxide covering layer comprises a stable oxide having a vapor pressure of $1\times10^{-4} N/m^2$ or less in the atmospheric air at 1500° C., and the oxidized product material from the self-recoverable layer contains an oxide having the same composition as that of the outermost surface oxide covering layer.

DESCRIPTION OF THE DRAWINGS

For a more complete understanding of the present invention and for further advantages thereof, reference is made to the following Detailed Description taken in conjunction with the accompanying drawings, in which.

It is to be noted, however, that the appended drawings illustrate only typical embodiments of this invention and are therefore not to be considered limiting of its scope, for the invention may admit to other equally effective embodiments.

DETAILED DESCRIPTION

Prior to the description of specific embodiments, the feature of a self-recoverable covering material of the present invention will be described below.

One embodiment of a self-recoverable layer according to the present invention includes a boron compound or silicon compound. The compound reacts with an oxidizing atmosphere, and produces a reaction product material capable of recovering cracks. In the present invention, to achieve the self-recovering function, the oxidized product material generated from the self-recoverable layer contains an oxide having the same composition as that of the outermost surface oxide covering layer. Moreover, in order that the self-recoverable layer can fully achieve the self-recovering function, the outermost surface covering layer resisting the environment is made of an oxide.

Figure 1:
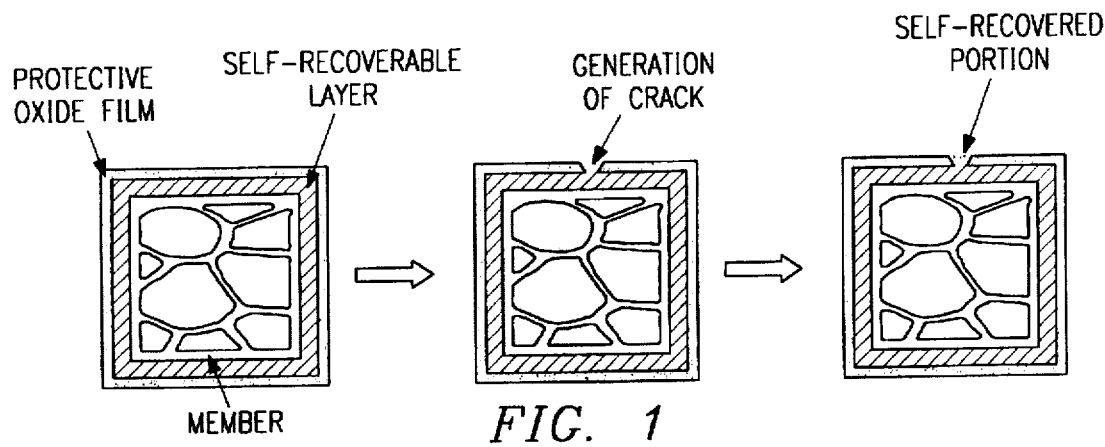
FIG. 1 is a top view showing the concept of a self-recoverable covering material according to an example of the present invention.

For example, according to one embodiment of the invention, the surface of a gas turbine moving blade made of silicon nitride is covered with a self-recoverable layer made of $ZrB_2$ and an outermost surface made of $ZrO_2$. In such a structure, cracks are given on the surface of the $ZrO_2$ layer. The structure is then kept in a high temperature oxidizing atmosphere at 1500° C. In this example, the $ZrB_2$ layer is oxidized to produce compounds of $ZrO_2$, $B_2O_3$ and $ZrBO$, and the cracks on the outermost $ZrO_2$ layer are recovered by the compounds containing the $ZrO_2$ component. The covering layer thus obtained has a reliability higher than that in a conventional structure covered with only the $ZrO_2$ layer. Here, the oxidizing rate of $ZrB_2$ is more than that of $ZrO_2$. $ZrO_2$ is stable at high temperatures, which has a vapor pressure of $5.6 \times 10^{-8} N/m^2$ in the atmospheric air at 1500° C. FIG. 1 is a view showing the concept of the self-recovering function.

According to various embodiments of the present invention, the surface of a member formed of at least one kind of ceramics, metals and C/C composites is covered with an oxide, and a layer containing at least a boron compound or silicon compound between the oxide and the member. In this member, thermal expansion coefficients of the member, intermediate layer, and oxide layer are gradually changed. This is because the thermal impact generates a lot of cracks, due to the difference in the thermal expansion coefficient, not only on the outermost surface oxide but also on the self-recoverable layer. In particular, when the difference in the thermal expansion coefficient is large, not only vertical cracks but also transverse cracks are generated, which causes the peeling of the layers.

To achieve the self-recovering function in some specific embodiments of the present invention, the self-recoverable layer comprises at least one kind of borides of Zr, Hf, Ta, Al and Y or at least one kind of silicates of Zr, Hf, Ta, Al and Y, in an amount of 30 vol % or more. When the content of the borides or silicates is less than 30 vol %, the dispersibility is poor as a whole, and, therefore, the recovering function cannot be fully achieved.

According to some embodiments, the self-recoverable layer includes one or more layers. To enhance the reliability, two or three layers are preferably provided.

According to yet a further embodiment of the invention, reaction product material obtained by the self-recovering function, mainly comprises one kind or more crystalline materials selected from a group consisting of: $ZrO_2$, $Al_2O_3$, $HfO_2$, zircon ($ZrO_2/SiO_2$), mullite ($3Al_2O_3/2SiO_2$), $ZrO_2$ and $B_2O_3$, $Al_2O_3$ and $B_2O_3$, zircon ($ZrO_2/SiO_2$) and $B_2O_3$, mullite ($3Al_2O_3/2SiO_2$) and $B_2O_3$, $HfO_2$ and $B_2O_3$, $Y_2O_3$ and $B_2O_3$, $Ta_2O_5$ and $B_2O_3$, $HfO_2$ and $SiO_2$, $Y_2O_3$ and $SiO_2$, and $Ta_2O_5$ and $SiO_2$. Alternately, the reaction product material comprises one kind or more of crystalline materials selected from a group consisting of $Al_2O_3$—$BaO$, $Al_2O_3$—$BeO$, $Al_2O_3$—$MgO$, $Al_2O_3$—$MnO$, $Al_2O_3$—$SiO_2$, $Al_2O_3$—$TiO_2$, $Al_2O_3$—$ZnO$, $Al_2O_3$—$ZrO_2$, $ZrO_2$—$TiO_2$, $ZrO_2$—$SiO_2$, $ZrO_2$—$Nb_2O_5$, $K_2O$—$Al_2O_3$—$SiO_2$, $MgO$—$Al_2O_3$—$SiO_2$, $Al_2O_3$—$CeO_2$, $CaO$—$Al_2O_3$—$SiO_2$, $BaO$—$Al_2O_3$—$SiO_2$, $FeO$—$Al_2O_3$—$SiO_2$, $CaO$—$MgO$—$SiO_2$, $CaO$—$ZrO_2$—$SiO_2$, $MgO$—$CaO$, $MgO$—$SiO_2$, Hexacelsian, $MgO$—$TiO_2$, $MgO$—$ZrO_2$, and $SiO_2$—$TiO_2$. The above oxides such as $ZrO_2$, $Al_2O_3$, $MgO$, $Y_2O_3$ are stable at high temperatures, which have vapor pressures of $1 \times 10^{-4} N/m^2$ or less in the atmospheric air at 1500° C.

When the self-recoverable layer is formed of vitreous oxides of B, Ba, Mg, Ti, Li, Na, Nb, K, and V, the temporary recovering is possible; however, the glass having a high vapor pressure disappears by vaporization, and does not act as the recoverable layer. The product material generated from the self-recovering layer must be stable in the service environment.

The present invention is not dependent on the structure to be covered. Therefore, the structure to be covered is not particularly limited, and, according to example embodiments comprise ceramics, metals and/or C/C composites. Examples of ceramic structure to be covered includes: SiC, mullite, $Si_3N_4$, sialon, AlN, and $Si_2N_2O$, and composite materials, for example: SiC, $ZrO_2$, mullite, $Si_3N_4$, AlN, $Al_2O_3$, $B_4C$, BN, $Si_2N_2O$, or $Y_2O_3$. According to embodiments of the invention, covered composites have a nano-composite structure where different particles are dispersed within matrix particles and/or at the grain boundaries. According to other embodiments, composites to be covered include, for example, a reaction-sintered composite material containing 5 to 60 vol % of inorganic compound composed of at least one kind of oxide, carbide, nitride and carbide-nitride and 95 to 40 vol % of metal nitride, which has a structure where the inorganic compound particles are bonded with each other by means of the metal nitride. According to still further embodiments, composites to be covered include metals and alloys such as Fe alloy, Al alloy, Ti alloy, Ni alloy, intermetallic compound, one-way solidified metal monocrystalline metal, cast iron, carbon steel, and heat-resisting steel.

As yet a further example of an embodiment of the present invention, there is provided a life diagnostic circuit on a mechanical structural component having a self-recoverable covering layer. In this case, the life diagnostic circuit is not provided throughout the whole component, but is provided only near the portion where the maximum stress is generated or only at the plane where oxidization is generated. However, the life diagnostic circuit must be provided near the surface of the self-recoverable layer (within 5 mm from the surface). In the structural member, cracks are first generated on the surface and generates the breakage; accordingly, it is required to sensitively detect the generation of the cracks on the surface of the self-recoverable layer. A bundle of fibers (usually: 100 to 1000) are provided as a resistance measuring circuit for life diagnosis. As cracks propagated from the surface cut the fibers, the resistivity is increased. When the resistivity exceeds the set-up threshold value, it is judged that maintenance is required. The equipment is stopped and the parts are exchanged. In the case of a bundle of long fibers, a bundle of combined short fibers or a bundle of fibers of combined particles, cracks cut the fibers in the bundle little by little, so that the resistivity is also increased little by little.

Figure 2:
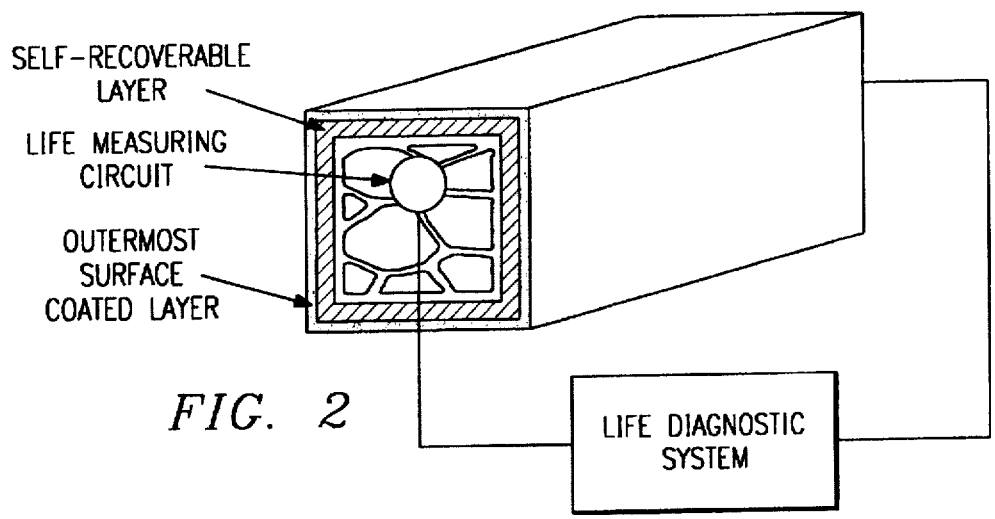
FIG. 2 is a life diagnostic circuit diagram showing another example of the present invention.

A conductive circuit may be provided near the covering layer of a mechanical structural component having a self-recoverable covering layer. The life of the self-recovering function can be predicted by measuring the change in the resistivity of the conductive circuit (FIG. 2). The conductive circuit for measuring the life is formed of fibers and particles having a low resistivity such as C, SiC, TiN, TiC, ZrN and $Cr_2N$. It may be formed of two kinds of fibers or particles having different elasticities for enhancing the efficiency of the life diagnosis. In particular, it is important that the conductive circuit for measuring a life serves as a reinforcing material for the mechanical structural component. The resistivity of the conductive circuit for measuring a life is changed due to the phenomena generated on a bundle of fibers constituting the conductive circuit, such as drawing, cutting, interface (contact) change, deformation, chemical corrosion, and temperature change. The conductive circuit measures the above change in the resistivity, and compares it with a threshold value, thus performing the prediction of a life, diagnosis of the life and the diagnosis of maintenance. For example, when cracks are generated on the surface and the self-recoverable layer is oxidized for achieving the recovering function, the further the oxidation proceeds, the conductive circuit for measuring the life is oxidized, thus increasing the resistance. The value thus obtained is read out, and is compared with a threshold value by a computer provided on the outside of the system. When the value exceeds the threshold value, the stopping signal is automatically outputted. Thus, it becomes possible to stop the equipment before breakage of the mechanical structural component, and to exchange the parts.

The change in the resistance value is supplied to a system, and the system is automatically stopped when the resistance value exceeds a threshold value, thereby performing the maintenance and checking.

Various embodiments of the covering method of the present invention include spraying, chemical deposition, physical deposition, coating, dipping, laminating, and the like. According to some embodiments, the actual covering method is selected based on adhesiveness and does not exert an effect on the self-recovering function. For metals and C/C composites, plasma spraying is desirable. For ceramics, plasma spraying, laminating and chemical deposition are desirable.

According to still a further embodiment of the present invention, a barrier for preventing oxidation is interposed between the surface of the structure made of a ceramic or C/C composite and the self-recoverable layer.

The present invention will be more clearly understood with reference to the following examples:

EXAMPLES 1 TO 95

The surface of each of structures made of ceramics and C/C composites shown in Table 1 was covered with each self-recoverable layer shown in Table 1 to a thickness of 200 μm, and each outermost surface layer such as $ZrO_2$ shown in Table 1 to a thickness of 200 μm by a powder type plasma spraying. The plasma spraying was performed by a method wherein plasma was generated using argon gas in a vacuum atmosphere. The self-recoverable layer and the outermost surface layer thus obtained were dense with a porosity of 3% or less. A crack having a width of 0.2 mm and a depth of 200 μm was given on the outermost surface of the structure. The structure was then kept for 100 hr in the atmospheric air at 1500° C. As a result, the crack portion was recovered by a product material generated by the reaction between the self-recoverable layer and oxygen in the atmospheric air at 1500 degrees C. Each component of the recovered portion was shown in Tables 1 to 3. The concept of the recovering function is shown in FIG. 1.

As a comparative example, a SiC sintered body was covered with $ZrO_2$ to a thickness of 200 μm without any self-recoverable layer. A crack having a width of 0.2 mm and a depth of 200 μm was given on the outermost surface of the SiC sintered body. The structure was then kept for 100 hr. in the atmospheric air at 1500° C.

Figure 8A:
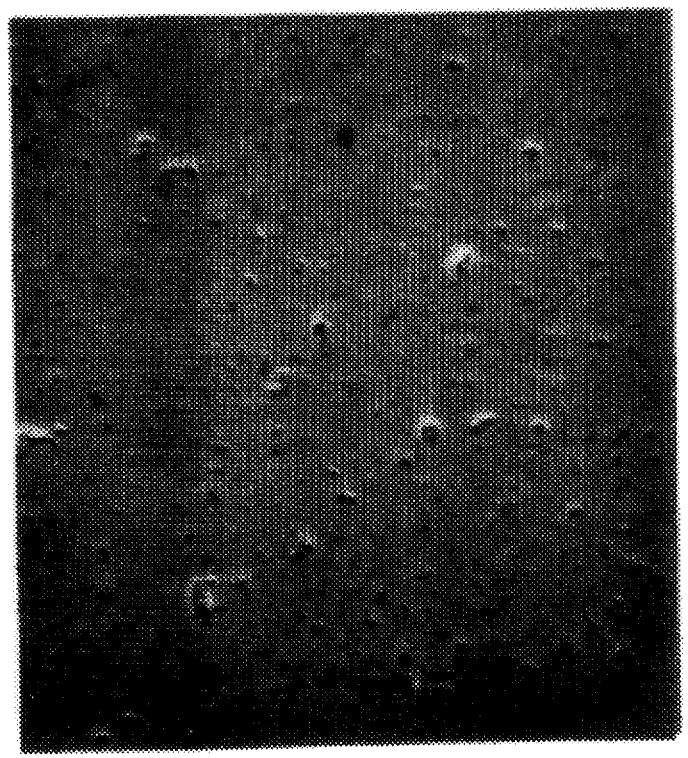
FIG. 8 are electron micrographs showing the crystal structures of SiC before and after an oxidizing test.
Figure 8B:
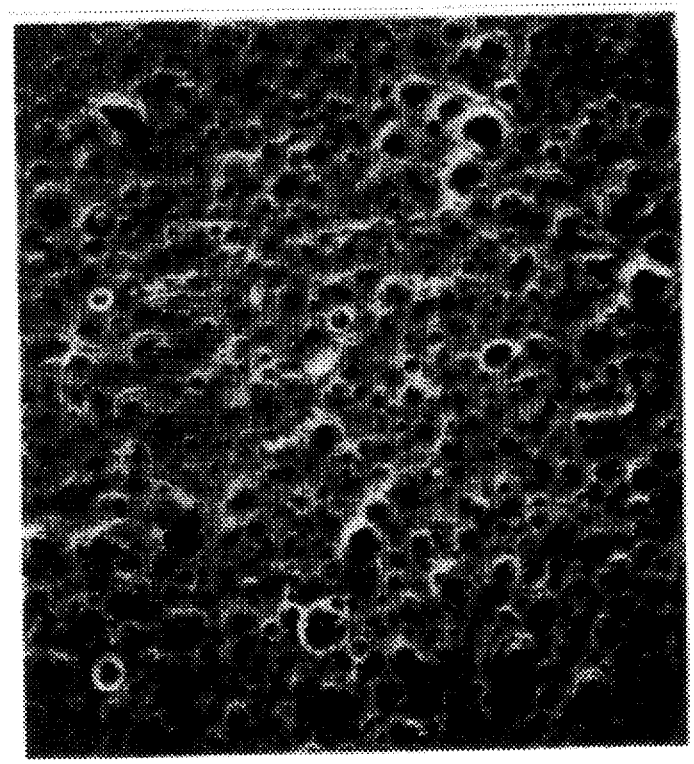

FIG. 8 shows electron micrographs of the above SiC sintered body before and after the oxidizing test. In these micrographs, multiple large voids were generated because $SiO_2$ was produced on the cracked portion of the surface of the SiC sintered body and then evaporated, as a result of which the SiC sintered body was eroded. As another comparative example, a $Si_3N_4$ sintered body was covered with $ZrO_2$ to a thickness of 200 μm without any self-recoverable layer. A crack having a width of 0.2 mm and a depth of 200 μm was given on the outermost surface of the $Si_3N_4$ sintered body. The structure was then kept for 100 hr. in the atmospheric air at 1500° C.

Figure 9A:
FIG. 9 are electron micrographs showing the crystal structures of $Si_3N_4$ before and after an oxidizing test.
Figure 9B:
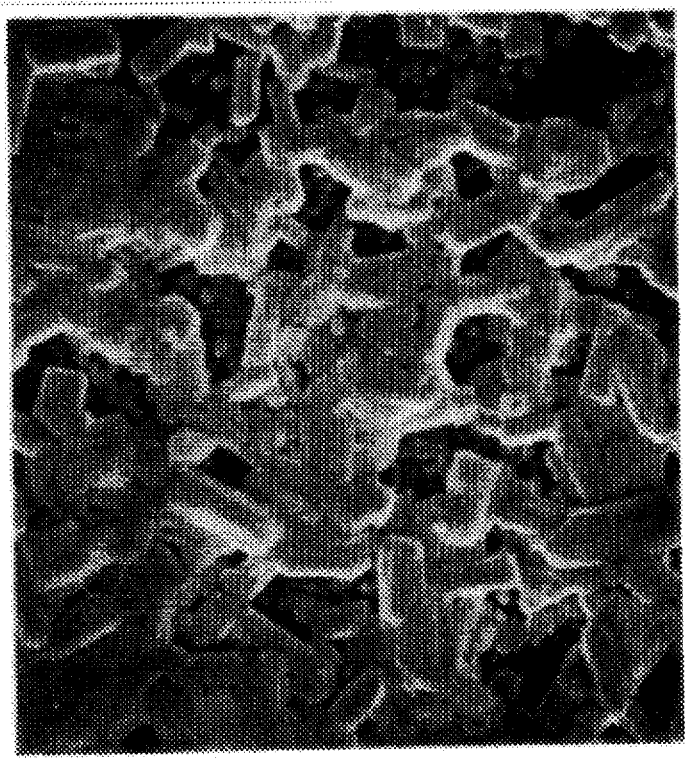

FIG. 9 shows electron micrographs of the above $Si_3N_4$ sintered body before and after the oxidizing test. In these micrographs, a $SiO_2$ oxide film was produced on the cracked portion of the surface of the $Si_3N_4$ sintered body and simultaneously an oxide of Yb as a sintering assist agent was melted and precipitated on the surface layer, as a result of which the $Si_3N_4$ sintered body was eroded. Consequently, it was revealed that the surface of SiC or $Si_3N_4$ sintered body with no self-recoverable layer was eroded by oxidization. The erosion causes the reduction in the reliability.

In these examples, it is important that the oxidizing rate of the self-recoverable layer is more than that of the outermost surface layer. The effect of the self-recoverable layers of the present invention is not limited to the ceramics and C/C composites used in these examples, but may be applied to all of ceramics, C/C composites and metals.

The outermost surface layer may be made of a compound resisting an outer environment, preferably, a compound such as $ZrO_2$, $Al_2O_3$, $Y_2O_3$, $HfO_2$ or $Ta_2O_5$ for a high temperature environment. In combination with the above compound, a self-recoverable layer is suitably selected from a boron of Zr, Al, Y, Hf or Ta.

$B_4C$, $B_4C+B$, or the like used for a self-recoverable layer has no self-recovering function. The reason for this is that CO gas is generated when $B_2O_3$ glass is produced by the reaction between $B_4C$, or $B_4C+B$, and oxygen in the atmospheric air; the reaction gas generates voids or cracks at the recovered portion; and the $B_2O_3$ glass is vaporized because of its large vapor pressure.

TABLE 1

| No. | Structure | Self-Recoverable Layer | Outermost Surface Layer | Recovered Product |
|---|---|---|---|---|
| 1 | $Si_3N_4$ | $ZrB_2$ | $ZrO_2$ | $ZrO_2$, $B_2O_3$ |
| 2 | $Si_3N_4$ | $TiB_2$ | $TiO_2$ | $TiO_2$, $B_2O_3$ |
| 3 | $Si_3N_4$ | $ZrB_2$ + $HfB_2$ | $ZrO_2$ | $ZrO_2$, $HfO_2$ |
| 4 | $Si_3N_4$ | $CaB_2$ | $CaO$ | $CaO$, $B_2O_3$ |
| 5 | $Si_3N_4$ | $WB$ | $WO_2$ | $WO_2$, $B_2O_3$ |
| 6 | $Si_3N_4$ | $LaB_2$ | $La_2O_3$ | $La_2O_3$, $B_2O_3$ |
| 7 | $Si_3N_4$ | $HfB_2$ | $HfO_2$ | $HfO_2$, $B_2O_3$ |
| 8 | $Si_3N_4$ | $TaB_2$ | $Ta_2O_5$ | $Ta_2O_5$, $B_2O_3$ |
| 9 | $Si_3N_4$ | $NbB_2$ | $Nb_2O_5$ | $Nb_2O_5$, $B_2O_3$ |
| 10 | $Si_3N_4$ | $FeB_2$ | $Fe_2O_3$ | $Fe_2O_3$, $B_2O_3$ |
| 11 | $Si_3N_4$ | $AlB_2$ | $Al_2O_3$ | $Al_2O_3$, $B_2O_3$ |
| 12 | $Si_3N_4$ | $ZrB_2$ + $SiO_2$ | $ZrO_2$ | $ZrO_2$, $ZrSiO_4$ |
| 13 | $Si_3N_4$ | $HfB_2$ + $SiO_2$ | $HfO_2$ | $HfO_2$, $HfSiO_4$ |
| 14 | $Si_3N_4$ | $ZrB_2$ + $TiB_2$ | $ZrO_2$ | $ZrO_2$, $B_2O_3$, $TiO_2$ |
| 15 | $Si_3N_4$ | $ZrB_2$ + $FeB_2$ | $ZrO_2$ | $Fe_2O_3$, $B_2O_3$, $ZrO_2$ |
| 16 | SiC | $ZrB_2$ | $ZrO_2$ | $ZrO_2$, $B_2O_3$ |
| 17 | SiC | $TiB_2$ | $TiO_2$ | $TiO_2$, $B_2O_3$ |

TABLE 1-continued

| No. | Structure | Self-Recoverable Layer | Outermost Surface Layer | Recovered Product |
|---|---|---|---|---|
| 18 | SiC | $CaB_2$ | CaO | $CaO, B_2O_3$ |
| 19 | SiC | WB | $WO_2$ | $WO_2, B_2O_3$ |
| 20 | SiC | $LaB_2$ | $La_2O_3$ | $La_2O_3, B_2O_3$ |
| 21 | SiC | $HfB_2$ | $HfO_2$ | $HfO_2, B_2O_3$ |
| 22 | SiC | $TaB_2$ | $Ta_2O_5$ | $Ta_2O_5, B_2O_3$ |
| 23 | SiC | $NbB_2$ | $Nb_2O_5$ | $Nb_2O_5, B_2O_3$ |
| 24 | SiC | $FeB_2$ | $Fe_2O_3$ | $Fe_2O_3, B_2O_3$ |
| 25 | SiC | $AlB_2$ | $Al_2O_3$ | $Al_2O_3, B_2O_3$ |
| 26 | SiC | $ZrB_2 + SiO_2$ | $ZrO_2$ | $ZrO_2, ZrSiO_4$ |
| 27 | SiC | $HfB_2 + SiO_2$ | $HfO_2$ | $HfO_2, HfSiO_4$ |
| 28 | SiC | $ZrB_2 + TiB_2$ | $ZrO_2$ | $ZrO_2, B_2O_3, TiO_2$ |
| 29 | SiC | $ZrB_2 + FeB_2$ | $ZrO_2$ | $Fe_2O_3, B_2O_3, ZrO_2$ |
| 30 | AlN | $ZrB_2$ | $ZrO_2$ | $ZrO_2, B_2O_3$ |
| 31 | AlN | $TiB_2$ | $TiO_2$ | $TiO_2, B_2O_3$ |
| 32 | AlN | $CaB_2$ | CaO | $CaO, B_2O_3$ |
| 33 | AlN | WB | $WO_2$ | $WO_2, B_2O_3$ |
| 34 | AlN | $LaB_2$ | $La_2O_3$ | $La_2O_3, B_2O_3$ |
| 35 | AlN | $HfB_2$ | $HfO_2$ | $HfO_2, B_2O_3$ |
| 36 | AlN | $TaB_2$ | $Ta_2O_5$ | $Ta_2O_5, B_2O_3$ |
| 37 | AlN | $NbB_2$ | $Nb_2O_5$ | $Nb_2O_5, B_2O_3$ |

TABLE 2

| No. | Structure | Self-Recoverable Layer | Outermost Surface Layer | Recovered Product |
|---|---|---|---|---|
| 38 | AlN | $FeB_2$ | $Fe_2O_3$ | $Fe_2O_3, B_2O_3$ |
| 39 | AlN | $AlB_2$ | $Al_2O_3$ | $Al_2O_3, B_2O_3$ |
| 40 | AlN | $ZrB_2 + SiO_2$ | $ZrO_2$ | $ZrO_2, ZrSiO_4$ |
| 41 | AlN | $HfB_2 + SiO_2$ | $HfO_2$ | $HfO_2, HfSiO_4$ |
| 42 | AlN | $ZrB_2 + TiB_2$ | $ZrO_2$ | $ZrO_2, B_2O_3, TiO_2$ |
| 43 | AlN | $ZrB_2 + FeB_2$ | $ZrO_2$ | $Fe_2O_3, B_2O_3, ZrO_2$ |
| 44 | Sialon | $ZrB_2$ | $ZrO_2$ | $ZrO_2, B_2O_3$ |
| 45 | Sialon | $TiB_2$ | $TiO_2$ | $TiO_2, B_2O_3$ |
| 46 | Sialon | $CaB_2$ | CaO | $CaO, B_2O_3$ |
| 47 | Sialon | WB | $WO_2$ | $WO_2, B_2O_3$ |
| 48 | Sialon | $LaB_2$ | $La_2O_3$ | $La_2O_3, B_2O_3$ |
| 49 | Sialon | $HfB_2$ | $HfO_2$ | $HfO_2, B_2O_3$ |
| 50 | Sialon | $TaB_2$ | $Ta_2O_5$ | $Ta_2O_5, B_2O_3$ |
| 51 | Sialon | $NbB_2$ | $Nb_2O_5$ | $Nb_2O_5, B_2O_3$ |
| 52 | Sialon | $FeB_2$ | $Fe_2O_3$ | $Fe_2O_3, B_2O_3$ |
| 53 | Sialon | $AlB_2$ | $ZrO_2, Al_2O_3$ | $Al_2O_3, B_2O_3$ |
| 54 | Sialon | $ZrB_2 + SiO_2$ | $ZrO_2$ | $ZrO_2, ZrSiO_4$ |
| 55 | Sialon | $HfB_2 + SiO_2$ | $HfO_2$ | $HfO_2, HfSiO_4$ |
| 56 | Sialon | $ZrB_2 + TiB_2$ | $ZrO_2$ | $ZrO_2, B_2O_3, TiO_2$ |
| 57 | Sialon | $ZrB_2 + FeB_2$ | $ZrO_2$ | $Fe_2O_3, B_2O_3, ZrO_2$ |
| 58 | Mullite | $ZrB_2$ | $ZrO_2$ | $ZrO_2, B_2O_3$ |
| 59 | Mullite | $TiB_2$ | $ZrO_2, TiO_2$ | $TiO_2, B_2O_3$ |
| 60 | Mullite | $CaB_2$ | CaO | $CaO, B_2O_3$ |
| 61 | Mullite | WB | $WO_2$ | $WO_2, B_2O_3$ |
| 62 | Mullite | $LaB_2$ | $La_2O_3$ | $La_2O_3, B_2O_3$ |
| 63 | Mullite | $HfB_2$ | $HfO_2$ | $HfO_2, B_2O_3$ |
| 64 | Mullite | $TaB_2$ | $Ta_2O_5$ | $TaO_5, B_2O_3$ |
| 65 | Mullite | $NbB_2$ | $Nb_2O_5$ | $Nb_2O_5, B_2O_3$ |
| 66 | Mullite | $FeB_2$ | $Fe_2O_3$ | $Fe_2O_3, B_2O_3$ |
| 67 | Mullite | $AlB_2$ | $Al_2O_3$ | $Al_2O_3, B_2O_3$ |
| 68 | Mullite | $ZrB_2 + SiO_2$ | $ZrO_2$ | $ZrO_2, ZrSiO_4$ |
| 69 | Mullite | $HfB_2 + SiO_2$ | $HfO_2$ | $HfO_2, HfSiO_4$ |
| 70 | Mullite | $ZrB_2 + TiB_2$ | $ZrO_2$ | $ZrO_2, B_2O_3, TiO_2$ |
| 71 | Mullite | $ZrB_2 + FeB_2$ | $ZrO_2$ | $Fe_2O_3, B_2O_3, ZrO_2$ |
| 72 | Sialon + SiC | $ZrB_2$ | $ZrO_2$ | $ZrO_2, B_2O_3$ |
| 73 | Sialon + TiN | $TiB_2$ | $ZrO_2, TiO_2$ | $TiO_2, B_2O_3$ |

TABLE 3

| No. | Structure | Self-Recoverable Layer | Outermost Surface Layer | Recovered Product |
|---|---|---|---|---|
| 74 | Sialon + $ZrO_2$ | $CaB_2$ | CaO | $CaO, B_2O_3$ |
| 75 | $Si_3N_4$ + SiC | WB | $WO_2$ | $WO_2, B_2O_3$ |
| 76 | $Si_3N_4$ + AlN | $LaB_2$ | $La_2O_3$ | $La_2O_3, B_2O_3$ |
| 77 | $Si_3N_4$ + $ZrO_2$ | $HfB_2$ | $HfO_2$ | $HfO_2, B_2O_3$ |
| 78 | $Si_2N_2O$ | $TaB_2$ | $Ta_2O_5$ | $Ta_2O_5, B_2O_3$ |
| 79 | $Si_3N_4$ + TiCN | $NbB_2$ | $Nb_2O_5$ | $Nb_2O_5, B_2O_3$ |
| 80 | $Si_3N_4$ + TiN | $FeB_2$ | $Fe_2O_3$ | $Fe_2O_3, B_2O_3$ |
| 81 | $Si_3N_4$ + Mo | $AlB_2$ | $Al_2O_3$ | $Al_2O_3, B_2O_3$ |
| 82 | Sialon + Mo | $ZrB_2 + TiB_2$ | $ZrO_2$ | $ZrO_2, B_2O_3, TiO_2$ |
| 83 | TiN | $ZrB_2 + FeB_2$ | $ZrO_2$ | $Fe_2O_3, B_2O_3, ZrO_2$ |
| 84 | BN | $AlB_2$ | $Al_2O_3$ | $Al_2O_3, B_2O_3$ |
| 85 | C/C composite | $ZrB_2$ | $ZrO_2$ | $ZrO_2, B_2O_3$ |
| 86 | C/C composite | $TiB_2$ | $TiO_2$ | $TiO_2, B_2O_3$ |
| 87 | C/C composite | $CaB_2$ | CaO | $CaO, B_2O_3$ |
| 88 | C/C composite | WB | $WO_2$ | $WO_2, B_2O_3$ |
| 89 | C/C composite | $LaB_2$ | $La_2O_3$ | $La_2O_3, B_2O_3$ |
| 90 | C/C composite | $HfB_2$ | $HfO_2$ | $HfO_2, B_2O_3$ |
| 91 | C/C composite | $TaB_2$ | $Ta_2O_5$ | $Ta_2O_5, B_2O_3$ |
| 92 | C/C composite | $NbB_2$ | $Nb_2O_5$ | $Nb_2O_5, B_2O_3$ |
| 93 | C/C composite | $ZrB_2$ | $ZrO_2$ | $ZrO_2, B_2O_3$ |
| 94 | C/C composite | $ZrB_2 + TiB_2$ | $ZrO_2$ | $ZrO_2, B_2O_3, TiO_2$ |
| 95 | C/C composite | $ZrB_2 + FeB_2$ | $ZrO_2$ | $Fe_2O_3, B_2O_3, ZrO_2$ |

EXAMPLES 96–102

Tests were made to examine the suitability of self-recoverable layers. The surface of a sample (10×10×5 mm) made of each structure shown in Table 4 was covered with each self-recoverable layer shown in Table 4 to a thickness of 200 μm, and each outermost surface layer such as $ZrO_2$ shown in Table 4 to a thickness of 200 μm by a powder type plasma spraying. A crack having a width of 0.2 mm and a depth of 200 μm was given on the surface of the sample. The sample was then kept for 100 hr. in the atmospheric air at 1500° C., which gave the result shown in Table 4. It was revealed that single $B_4C$, single B and ($B_4C+SiO_2$) are evaporated and they had no recovering function for cracks.

Figure 10:
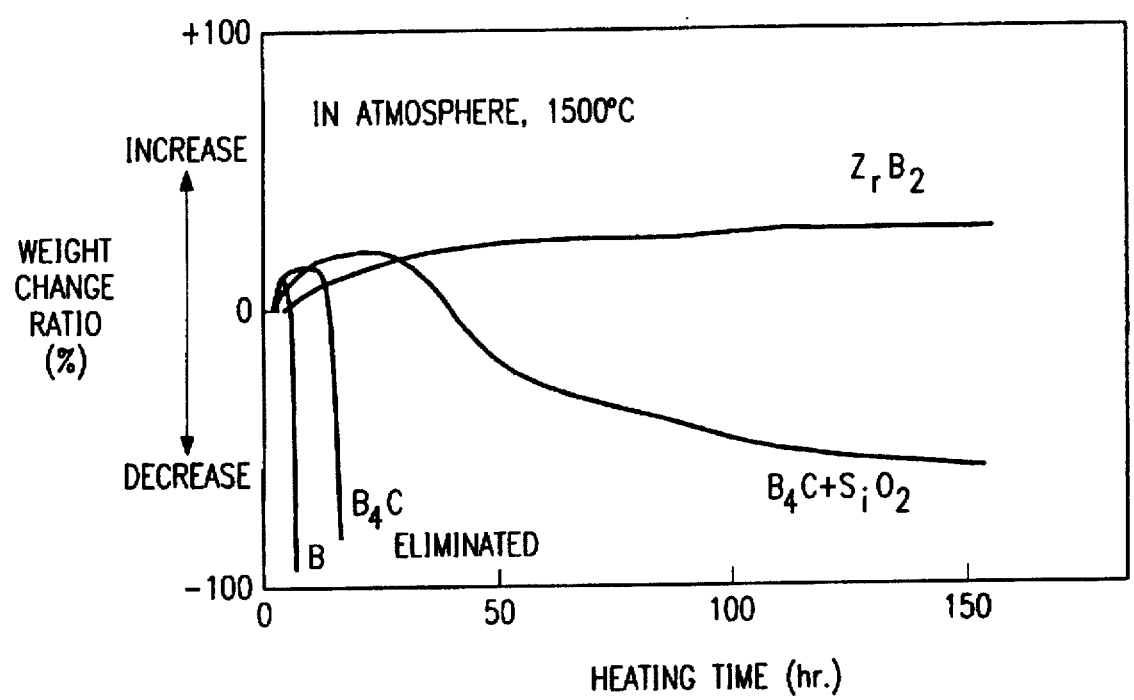
FIG. 10 is a diagram showing the change of weight in the thermal analysis made for a self-recoverable covering material according to an example of the present invention.

Next, the change of a self-recoverable layer by the high temperature oxidization was measured by a thermobalance, which gave the result shown in FIG. 10. From this figure, it was confirmed that single $B_4C$, single B were perfectly evaporated by oxidization and ($B_4C+SiO_2$) was reduced in weight by 50 wt % by oxidization.

TABLE 4

| No. | Structure | Self-Recoverable Layer | Outermost Surface Layer | Recovered Product |
|---|---|---|---|---|
| 96 | $Si_3N_4$ | $B_4C$ | $ZrO_2$ | Absence of recovering function $Si_3N_4$, eroded |
| 97 | SiC | BN | $ZrO_2$ | Absence of recovering function SiC, eroded |
| 98 | SiC | B | $ZrO_2$ | Absence of recovering function SiC, eroded |
| 99 | C/C | $B_4C + SiO_2$ | SiC | Absence of recovering function C/C, eroded |
| 100 | C/C | $BN + SiO_2$ | SiC | Absence of recovering function C/C, eroded |
| 101 | C/C | $B + SiO_2$ | SiC | Absence of recovering function C/C, eroded |
| 102 | C/C | $ZrB_2$ | $ZrO_2$ | Presence of recovering function C/C, recovered by $ZrO_2$ and the like |

EXAMPLES 103–132

The surface of each of the structures made of ceramics and C/C composites shown in Table 5 was covered with each self-recoverable layer shown in Table 5 to a thickness of 200 μm, and an outermost surface layer made of each oxide shown in Table 5 to a thickness of 150 μm by a powder type plasma spraying. The plasma spraying was performed by a method wherein plasma was generated using argon gas in a vacuum atmosphere. The self-recoverable layer and the outermost layer thus obtained were dense with a porosity of 3% or less. A crack having a width of 0.2 mm and a depth of 150 μm was given on the outermost surface of the structure. The structure was then kept for 100 hr. in the atmospheric air at 1500° C. As a result, the cracked portion was recovered by a product material generated by the reaction between the self-recoverable layer and oxygen in the atmospheric air. Each component of the recovered portion was shown in Table 5.

In these examples, it is important that the oxidizing rate of the self-recoverable layer is greater than that of the outermost surface layer. The effect of the self-recoverable layers of the present invention is not limited to the ceramics and C/C composites used in these examples, but may be applied to all of ceramics, C/C composites and metals.

In comparative examples, shown in Table 6, the oxidizing rate of the self-recoverable layer is less than that of the outermost surface layer. In such a covering structure, cracks generated on the outermost surface layer are temporarily recovered by the oxidizing reaction of the outermost surface layer; however, the essential recovering function cannot be obtained because the whole of the outermost surface layer is oxidized and eroded.

TABLE 5

| No. | Structure | Self-Recoverable Layer | Outermost Surface Layer | Recovered Product |
|---|---|---|---|---|
| 103 | $Si_3N_4$ | $ZrB_2$ | $ZrO_2, Al_2O_3$ | $ZrO_2, B_2O_3$ |
| 104 | $Si_3N_4$ | $TiB_2$ | $TiO_2, Al_2O_3$ | $TiO_2, B_2O_3$ |
| 105 | SiC | $CaB_2$ | $CaO, Al_2O_3$ | $CaO, B_2O_3$ |
| 106 | Mullite | WB | $WO_2, Al_2O_3$ | $WO_2, B_2O_3$ |
| 107 | Sialon | $LaB_2$ | $La_2O_3, Al_2O_3$ | $La_2O_3, B_2O_3$ |
| 108 | C/C composite | $HfB_2$ | $HfO_2, Al_2O_3$ | $HfO_2, B_2O_3$ |
| 109 | $Si_3N_4$ + SiC | $TaB_2$ | $Ta_2O_5, Al_2O_3$ | $Ta_2O_5, B_2O_3$ |
| 110 | $Si_3N_4$ | $NbB_2$ | $Nb_2O_5, Al_2O_3$ | $Nb_2O_5, B_2O_3$ |
| 111 | $Si_3N_4$ | $FeB_2$ | $Fe_2O_3, Al_2O_3$ | $Fe_2O_3, B_2O_3$ |
| 112 | $Si_3N_4$ | $AlB_2$ | $Al_2O_3$ | $Al_2O_3, B_2O_3$ |
| 113 | $Si_3N_4$ | $ZrB_2$ + $HfB_2$ + $AlB_2$ | $ZrO_2, Al_2O_3$ | $ZrO_2, HfO_2, Al_2O_3$ |
| 114 | $Si_3N_4$ + $ZrO_2$ | $ZrB_2$ + $TiB_2$ | $ZrO_2, Al_2O_3$ | $ZrO_2, B_2O_3, TiO_3$ |
| 115 | $Si_3N_4$ + AlN | $ZrB_2$ + $FeB_2$ | $ZrO_2, Al_2O_3$ | $Fe_2O_3, B_2O_3, ZrO_2$ |
| 116 | SiC | $ZrB_2$ | Zircon | $ZrO_2, B_2O_3$ |
| 117 | SiC | $TiB_2$ | $TiO_2, Cr_2O_3$ | $ZrO_2, B_2O_3$ |
| 118 | $Si_3N_4$ + SiC | $CaB_2$ | $CaO, Cr_2O_3$ | $CaO, B_2O_3$ |
| 119 | AlN | WB | $WO_2, TiO_2$ | $WO_2, B_2O_3$ |
| 120 | Mullite | $LaB_2$ | $La_2O_3, SiO_2$ | $La_2O_3, B_2O_3$ |
| 121 | Sialon | $YB_2$ | $Y_2O_3$ | $Y_2O_3, B_2O_3$ |
| 122 | C/C composite | $YB_2$ | $ZrO_2, Y_2O_3$ | $Y_2O_3, B_2O_3$ |
| 123 | SiC | $NbB_2$ | $Y_2O_3$ | $Nb_2O_5, B_2O_3$ |
| 124 | $Si_2N_2O$ | $ZrB_2$ | Zircon | $ZrO_2, B_2O_3$ |
| 125 | Sialon + $ZrO_2$ | $AlB_2$ | $Al_2O_3$ | $Al_2O_3, B_2O_3$ |
| 126 | Sialon + TiN | $ZrB_2$ + $TiB_2$ | $ZrO_2, Y_2O_3$ | $ZrO_2, B_2O_3, TiO_2$ |
| 127 | Sialon + SiC | $ZrB_2$ + $FeB_2$ | $ZrO_2, Cr_2O_3$ | $Fe_2O_3, B_2O_3, ZrO_2$ |
| 128 | $Si_3N_4$ + TiN | $FeB_2$ | $ZrO_2, Cr_2O_3$ | $ZrO_2, B_2O_3$ |
| 129 | $Si_3N_4$ + Mo | $AlB_2$ | $Al_2O_3$ | $Al_2O_3, B_2O_3$ |
| 130 | Sialon + Mo | $ZrB_2$ + $TiB_2$ | Zircon | $ZrO_2, B_2O_3, TiO_2$ |
| 131 | TiN | $ZrB_2$ + $FeB_2$ | $ZrO_2, Y_2O_3$ | $Fe_2O_3, B_2O_3, ZrO_2$ |
| 132 | BN | $AlB_2$ | $Al_2O_3, TiO_2$ | $Al_2O_3, B_2O_3$ |

TABLE 6

| Comparative Example No. | Structure | Self-Recoverable Layer | Outermost Surface Layer | Recovered Product |
|---|---|---|---|---|
| 1 | $Si_3N_4$ | $Al_2O_3$ | $ZrB_2$ | None |
| 2 | $Si_3N_4$ | $Al_2O_3$ | $TiB_2$ | None |
| 3 | $Si_3N_4$ | SiC | BN | None |
| 4 | SiC | $ZrO_2$ | $ZrB_2$ | None |

EXAMPLES 133–155

The surface of each of the structures made of metals and alloys shown in Table 7 was covered with each self-recoverable layer shown in Table 7 to a thickness of 200 μm, and an outermost surface layer made of each oxide shown in Table 7 to a thickness of 150 μm by a powder type plasma spraying. The plasma spraying was performed by a method wherein plasma was generated using argon gas in a vacuum atmosphere. The self-recoverable layer and the outermost layer thus obtained were dense with a porosity of 3% or less. A crack having a width of 0.2 mm and a depth of 150 μm was given on the outermost surface of the structure. The structure was then kept for 100 hr. in the atmospheric air at 1500° C., while the interior of the structure was cooled by water. As a result, the cracked portion was recovered by a product material generated by the reaction between the self-recoverable layer and oxygen in the atmospheric air. Each component of the recovered portion was shown in Table 7.

From these examples, it becomes apparent that the self-recovering function of the present invention is not affected by a covering material. Structures to be covered may include ceramics, C/C composites, and metals and alloys.

TABLE 7

| No. | Structure | Self-Recoverable Layer | Outermost Surface Layer | Recovered Product |
|---|---|---|---|---|
| 133 | Stainless Steel | $ZrB_2$ | $ZrO_2$ | $ZrO_2, B_2O_3$ |
| 134 | Stainless Steel | $TiB_2$ | $TiO_2, Al_2O_3$ | $TiO_2, B_2O_3$ |
| 135 | Stainless Steel | $CaB_2$ | $CaO, ZrO_2$ | $CaO, B_2O_3$ |
| 136 | Cast iron | WB | $WO_2, Al_2O_3$ | $WO_2, B_2O_3$ |
| 137 | $Nb_3Al$ | $LaB_2$ | $La_2O_3, Al_2O_3$ | $La_2O_3, B_2O_3$ |
| 138 | Ni alloy | $HfB_2$ | $HfO_2, Al_2O_3$ | $HfO_2, B_2O_3$ |
| 139 | Ni alloy | $TaB_2$ | $Ta_2O_5, Al_2O_3$ | $Ta_2O_5, B_2O_3$ |
| 140 | Cr alloy | $NbB_2$ | $Nb_2O_5, Al_2O_3$ | $Nb_2O_5, B_2O_3$ |
| 141 | Carbon steel | $AlB_2$ | $Al_2O_3$ | $Al_2O_3, B_2O_3$ |
| 142 | Cr—Ni alloy | $ZrB_2$ | $ZrO_2$ | $ZrO_2, B_2O_3$ |

TABLE 7-continued

| No. | Structure | Self-Recoverable Layer | Outermost Surface Layer | Recovered Product |
|---|---|---|---|---|
| 143 | Cr—Ni alloy | $ZrB_2 + AlB_2$ | $Al_2O_3$ | $ZrO_2, Al_2O_3$ |
| 144 | Fee Cutting steel; | $ZrB_2 + FeB_2$ | $ZrO_2, Al_2O_3$ | $FeO_3, B_2O_3, ZrO_2$ |
| 145 | Heat-resisting steel | $ZrB_2 + TiB_2$ | $ZrO_2, Al_2O_3$ | $ZrO_2, B_2O_3, TiO_2$ |
| 146 | Rolled steel | $NbB_2$ | $Nb_2O_5, Al_2O_3$ | $Nb_2O_5, B_2O_3$ |
| 147 | Inconel | $NbB_2$ | $Nb_2O_5, ZrO_2$ | $Nb_2O_5, B_2O_3$ |
| 148 | $Ni_3(Al, Ti)$ | $ZrB_2 + TiB_2$ | $ZrO_2, Al_2O_3$ | $ZrO_2, B_2O_3, TiO_2$ |
| 149 | Fiber-reinforced Al | $AlB_2$ | $Al_2O_3$ | $Al_2O_3, B_2O_3$ |
| 150 | SiC particle dispersion-strengthened Ti metal | $ZrB_2$ | $ZrO_2$ | $ZrO_2, B_2O_3$ |
| 151 | One-way eutectic alloy (Cr—TaC) | $TiB_2$ | $TiO_2, Al_2O_3$ | $TiO_2, B_2O_3$ |
| 152 | Al alloy | $ZrB_2$ | $ZrO_2$ | $ZrO_2, B_2O_3$ |
| 153 | Ti alloy | $ZrB_2$ | $ZrO_2$ | $ZrO_2, B_2O_3$ |
| 154 | Al alloy | $ZrB_2$ | $ZrO_2, Al_2O_3$ | $ZrO_2, B_2O_3$ |
| 155 | SiC particle dispersion-strengthened Ti metal | $ZrB_2$ | $ZrO_2, SiC$ | $ZrO_2, B_2O_3$ |

EXAMPLES 156–164

The surface of each structure shown in Table 8 was covered with three or more layers including a self-recoverable layer having a thickness of 200 μm, and an outermost surface layer having a thickness of 100 μm by a powder type plasma spraying. The plasma spraying was performed by a method wherein plasma was generated using argon gas in a vacuum atmosphere. The self-recoverable layer and the outermost layer thus obtained were dense, with a porosity of 3% or less.

Each structure of the covering layers is shown in Table 8. Each layer such as the self-recoverable layer is dense, with a porosity of 3% or less. A crack having a width of 0.2 mm and a depth of 100 μm up to the self-recoverable layer was given on the outermost surface of the structure. The structure was then kept for 100 hr. in the atmospheric air at 1500° C. As a result, the cracked portion was recovered by a product material generated by the reaction between the self-recoverable layer and oxygen in the atmospheric air at 1500 degrees C.

TABLE 8

| No | Structure | Self-Recoverable Layer and Outermost Surface Layer | | Recovered Product |
|---|---|---|---|---|
| 156 | $Si_3N_4$ | First layer: | $ZrO_2$ | $ZrO_2, B_2O_3$ |
| | | Second layer: | $ZrB_2$ self-recoverable layer | |
| | | Third layer: | $ZrO_2$ | |
| 157 | Sialon | First layer: | $Al_2O_3, TiO_2$ | $ZrO_2, B_2O_3$ |
| | | Second layer: | $ZrB_2$ self-recoverable layer | |
| | | Third layer: | $ZrO_2$ | |
| 158 | Sialon | First layer: | $Al_2O_3, TiO_2$ | $ZrO_2, B_2O_3$ |
| | | Second layer: | $Al_2O_3$ | |
| | | Third layer: | $ZrB_2$ self-recoverable layer | |
| | | Fourth layer: | $ZrO_2$ | |
| 159 | Inconel | First layer: | $Al_2O_3, TiO_2$ | $Al_2O_3, B_2O_3$ |
| | | Second layer: | $AlB_2$ self-recoverable layer | $ZrO_2, B_2O_3$ |
| | | Third layer: | $Al_2O_3$ | |
| | | Fourth layer: | $ZrB_2$ self-recoverable layer | |
| | | Fifth layer: | $ZrO_2$ | |
| 160 | SiC | First layer: | $Si_3N_4$ | $TiO_2, B_2O_3$ |
| | | Second layer: | $TiB_2$ self-recoverable layer | $ZrO_2, B_2O_3$ |
| | | Third layer: | $ZrB_2$ self-recoverable layer | |
| | | Fourth layer: | $ZrO_2$ | |
| 161 | Sialon | First layer: | AlN | |
| | | Second layer: | $ZrB_2$ self-recoverable layer | $ZrO_2, B_2O_3$ |
| | | Third layer: | $ZrO_2, Al_2O_3$ | |

TABLE 8-continued

| No | Structure | Self-Recoverable Layer and Outermost Surface Layer | | Recovered Product |
|---|---|---|---|---|
| 162 | $Si_3N_4$ | First layer: | Ni alloy | $Nb_2O_3$, $B_2O_3$ |
| | | Second layer: | $NbB_2$ self-recoverable layer | $ZrO_2$, $B_2O_3$ |
| | | Third layer: | $ZrB_2$ self-recoverable layer | |
| | | Fourth layer: | $ZrO_2$ | |
| 163 | Inconel | First layer: | $Al_2O_3$, $TiO_2$ | $ZrO_2$, $B_2O_3$ |
| | | Second layer: | TiC | |
| | | Third layer: | $Al_2O_3$ | |
| | | Fourth layer: | $ZrB_2$ self-recoverable layer | |
| | | Fifth layer: | $ZrO_2$ | |
| 164 | $Nb_3Al$ | First layer: | $Al_2O_3$ | $ZrO_2$, $B_2O_3$ |
| | | Second layer: | $ZrB_2$ self-recoverable layer | |
| | | Third layer: | $ZrO_2$ | |

EXAMPLES 165–173

Tests were made to examine what effect the difference in the thermal expansion coefficient between covering layers would exert on the self-recovering function.

The surface of each structure shown in Table 9 was covered with three or more layers including a self-recoverable layer having a thickness of 200 μm, and an outermost surface layer having a thickness of 100 μm by a powder type plasma spraying. The plasma spraying was performed by a method wherein plasma was generated using argon gas in a vacuum atmosphere. The self-recoverable layer and the outermost surface layer were dense, with a porosity of 3% or less. The structure of the covering layers is shown in Table 9. The structure thus covered was heated from room temperature to 500° C. and then cooled by water. Thus, the structure was examined for the state of the interface between the covering layers.

As a result, it is revealed that when the difference in the thermal expansion coefficient between some covering layers including the self-recoverable layer is increased to be more than $4 \times 10^{-6}/°C$., peeling is generated, which fails to achieve the self-recovering function with a high reliability. Accordingly, it is possible to obtain covering layers having a self-recovering function being excellent in the thermal shock resistance by controlling the thermal expansion coefficients between respective covering layers to be gradually changed.

TABLE 9

| No. | Structure | Self-Recoverable Layer and Outermost Surface Layer | Recovered Product | Result of Test |
|---|---|---|---|---|
| 165 | $Si_3N_4$ $3 \times 10^{-6}/°C$. | Second layer: $TiB_2(7.9 \times 10^{-6}/°C.)$ Third layer: $ZrO_2(8.0 \times 10^{-6}/°C.)$ | $TiO_2$, $B_2O_3$ | Partial generation of separation |
| 166 | $Si_3N_4$ $4 \times 10^{-6}/°C$. | Second layer: $ZrB_2(5.8 \times 10^{-6}/°C.)$ Third layer: $ZrO_2(8.0 \times 10^{-6}/°C.)$ | $ZrO_2$, $B_2O_3$ | Good |
| 167 | Sialon $3.2 \times 10^{-6}/°C$. | Second layer $ZrB_2(5.8 \times 10^{-6}/°C.)$ Third layer: $ZrO_2(8.0 \times 10^{-6}/°C.)$ | $ZrO_2$, $B_2O_3$ | Good |
| 168 | $Si_3N_4$ $3 \times 10^{-6}/°C$. | Second layer: $TiB_2(7.9 \times 10^{-6}/°C.)$ Third layer: $ZrO_2$, $TiO_2(8.0 \times 10^{-6}/°C.)$ | $TiO_2$, $B_2O_3$ | Partial generation of separation |
| 169 | $Si_3N_4$ $3 \times 10^{-6}/°C$. | First layer: $ZrB_2 + Si_3N_4$ $(4.0 \times 10^{-6}/°C.)$ Second layer: $ZrO_2(8.0 \times 10^{-6}/°C.)$ | $ZrO_2$, $B_2O_3$ | Good |
| 170 | Carbon steel $12 \times 10^{-6}/°C$. | First layer: $TiO_2(9.0 \times 10^{-6}/°C.)$ Second layer: $TiB_2(7.9 \times 10^{-6}/°C.)$ Third layer: $TiO_2$, $ZrO_2$ $(8.5 \times 10^{-6}/°C.)$ | $TiO_2$, $B_2O_3$ | Good |

TABLE 9-continued

| No. | Structure | Self-Recoverable Layer and Outermost Surface Layer | Recovered Product | Result of Test |
|---|---|---|---|---|
| 171 | Carbon steel $12 \times 10^{-6}/°C$. | First layer: $TiB_2 (7.9 \times 10^{-6}/°C.)$ Second layer: $TiO_2, ZrO_2$ $(8.5 \times 10^{-6}/°C.)$ | $TiO_2, B_2O_3$ | Partial generation of separation |
| 172 | Stainless steel $13 \times 10^{-6}/°C$. | First layer: $TiO_2 (9.0 \times 10^{-6}/°C.)$ Second layer: $ZrO_2 (5.8 \times 10^{-6}/°C.)$ Third layer: $ZrO_2 (8.0 \times 10^{-6}/°C.)$ | $ZrO_2, B_2O_3$ | Good |
| 173 | Stainless steel $13 \times 10^{-6}/°C$. | First layer: $TiB_2 (7.9 \times 10^{-6}/°C.)$ Second layer $ZrB_2 (5.8 \times 10^{-6}/°C.)$ Third layer: $ZrO_2 (8.0 \times 10^{-6}/°C.)$ | $ZrO_2, B_2O_3$ | Partial generation of separation |

EXAMPLES 174–228

The surface of each structure shown in Table 10 was covered with each self-recoverable layer shown in Table 10 to a thickness of 200 µm, and each outermost surface layer such as $ZrO_2$ shown in Table 10 to a thickness of 200 µm by a powder type plasma spraying. The plasma spraying was performed by a method wherein plasma was generated using argon gas in a vacuum atmosphere. The self-recoverable layer and the outermost layer thus obtained were dense with a porosity of 3% or less. A crack having a width of 0.2 mm and a depth of 200 µm was given on the outermost surface of the structure. The structure was then kept for 100 hr. in the atmospheric air at 1500° C. As a result, the cracked portion was recovered by a product material generated by the reaction between the self-recoverable layer and oxygen in the atmospheric air at 1500° C. Each component of the recovered portion was shown in Tables 10 and 11.

TABLE 10

| No. | Structure | Self-Recoverable Layer | Outermost Surface Layer | Recovered Product |
|---|---|---|---|---|
| 174 | $Si_3N_4$ | ZrSi | $ZrO_2$ | $ZrO_2, SiO_2$ |
| 175 | $Si_3N_4$ | TiSi | $TiO_2, ZrO_2$ | $TiO_2, SiO_2$ |
| 176 | $Si_3N_4$ | MoSi | $ZrO_2, SiO_2$ | $MoO, SiO_2$ |
| 177 | $Si_3N_4$ | FeSi | $ZrO_2, SiO_2$ | $Fe_2O_3, SiO_2$ |
| 178 | $Si_3N_4$ | CoSi | $ZrO_2, SiO_2$ | $CoO_2, SiO_2$ |
| 179 | $Si_3N_4$ | LaSi | $ZrO_2, SiO_2$ | $La_2O_3, SiO_2$ |
| 180 | $Si_3N_4$ | HfSi | $ZrO_2, SiO_2$ | $HfO_2, SiO_2$ |
| 181 | $Si_3N_4$ | TaSi | $ZrO_2, SiO_2$ | $TaO_2, SiO_2$ |
| 182 | $Si_3N_4$ | NbSi | $ZrO_2, SiO_2$ | $Nb_2O_5, SiO_2$ |
| 183 | $Si_3N_4$ | AlSi | $ZrO_2, Al_2O_3$ | $Al_2O_3, SiO_2$ |
| 184 | $Si_3N_4$ | NiSi | $ZrO_2, SiO_2$ | $NiO_2, SiO_2$ |
| 185 | $Si_3N_4$ | $ZrB_2 + ZrSi$ | $ZrO_2, SiO_2$ | $ZrO_2, B_2O_3, SiO_2$ |
| 186 | $Si_3N_4$ | $ZrSi + MoSi$ | $ZrO_2, SiO_2$ | $ZrO_2, SiO_2, MoO$ |
| 187 | $Si_3N_4$ | $ZrSi + AlSi$ | $ZrO_2, SiO_2$ | $ZrO_2, SiO_2, Al_2O_3$ |
| 188 | SiC | AlSi | $Al_2O_3$ | $Al_2O_3, SiO_2$ |
| 189 | Mullite | NiSi | $ZrO_2, SiO_2$ | $NiO_2, SiO_2$ |
| 190 | Sialon | $ZrB_2 + Zrsi$ | $ZrO_2, SiO_2$ | $ZrO_2, B_2O_3, SiO_2$ |
| 191 | AlN | $ZrSi + MoSi$ | $ZrO_2, Al_2O_3$ | $ZrO_2, SiO_{2, MoO}$ |
| 192 | C/C composite | $ZrB_2 + ZrSi$ | $ZrO_2, SiO_2$ | $ZrO_2, B_2O_3, SiO_2$ |
| 193 | Sialon + SiC | $ZrB_2 + ZrSi$ | $ZrO_2$ | $ZrO_2, B_2O_3, SiO_2$ |
| 194 | Sialon + TiN | $ZrSi + B_4C$ | $ZrO_2$ | $ZrO_2, SiO_2, B_2O_3, SiC$ |
| 195 | C/C composite | AlSi | $Al_2O_3$ | $Al_2O_3, SiO_2$ |
| 196 | Sialon + $ZrO_2$ | $ZrSi + MoSi$ | $ZrO_2$ | $ZrO_2, SiO_2, MoO$ |
| 197 | $Si_3N_4 + SiC$ | $ZrSi + MoSi$ | $ZrO_2$ | $ZrO_2, SiO_2, MoO$ |
| 198 | $Si_3N_4 + AlN$ | $TiB_2 + ZrSi$ | $ZrO_2, Al_2O_3$ | $TiO_2, ZrO_2, B_2O_3, SiO_2$ |
| 199 | $Si_3N_4 + ZrO_2$ | $ZrB_2 + ZrSi$ | $ZrO_2$ | $ZrO_2, B_2O_3, SiO_2$ |
| 200 | $Si_2N_2O$ | $ZrSi + B_4C$ | $ZrO_2$ | $ZrO_2, SiO_{2, B2O3}, SiC$ |
| 201 | $Si_3N_4 + TiCN$ | $TiB_2 + ZrSi$ | $ZrO_2, Al_2O_3$ | $TiO_2, ZrO_2, B_2O_3, SiO_2$ |
| 202 | $Si_3N_4 + TiN$ | ZrSi | $ZrO_2$ | $ZrO_2, SiO_2$ |
| 203 | $Si_3N_4 + Mo$ | $ZrB_2 + ZrSi$ | $ZrO_2$ | $ZrO_2, B_2O_3, SiO_2$ |
| 204 | $Si_3N_4 + WC$ | $TiB_2 + ZrSi$ | $ZrO_2$ | $TiO_2, ZrO_2, B_2O_3, SiO_2$ |
| 205 | Sialon + WC | ZrSi | $ZrO_2$ | $ZrO_2, SiO_{2, B2O3}, SiC$ |
| 206 | BN | $ZrB_2 + ZrSi$ | $ZrO_2, Al_2O_3$ | $ZrO_2, B_2O_3, SiO_2$ |

TABLE 10-continued

| No. | Structure | Self-Recoverable Layer | Outermost Surface Layer | Recovered Product |
|---|---|---|---|---|
| 207 | TiN | $TiB_2$ + ZrSi | $ZrO_2$ | $TiO_2$, $ZrO_2$, $B_2O_3$, $SiO_2$ |
| 208 | TiC | ZrSi | $ZrO_2$ | $ZrO_2$, $SiO_2$, $B_2O_3$, $Si_3N_4$ |
| 209 | WC | ZrSi | $ZrO_2$ | $ZrO_2$, $SiO_2$, $B_2O_3$, SiC |

TABLE 11

| No. | Structure | Self-Recoverable Layer | Outermost Surface Layer | Recovered Product |
|---|---|---|---|---|
| 210 | $Si_3N_4$ | ZrSi | $ZrO_2$ | $ZrO_2$, $SiO_2$, $B_2O_3$, SiC |
| 211 | $Si_3N_4$ | $TiB_2$ + ZrSi | $ZrO_2$ | $TiO_2$, $ZrO_2$, $B_2O_3$, $SiO_2$ |
| 212 | $Si_3N_4$ | $TiB_2$ + ZrSi | $ZrO_2$ | $TiO_2$, $ZrO_2$, $B_2O_3$, $SiO_2$ |
| 213 | C/C composite | ZrSi | Zircon | $ZrO_2$, $SiO_2$ |
| 214 | $Si_3N_4$ + SiC | FeSi | $ZrO_2$, $Fe_2O_3$ | $Fe_2O_3$, $SiO_2$ |
| 215 | $Si_3N_4$ + $ZrO_2$ | $ZrB_2$ + ZrSi | $ZrO_2$, $Al_2O_3$ | $ZrO_2$, $B_2O_3$, $SiO_2$ |
| 216 | $Si_3N_4$ + AlN | ZrSi | Zircon | $ZrO_2$, $SiO_2$ |
| 217 | $Si_3N_4$ + SiC | TiSi | $ZrO_2$, $SiO_2$ | $TiO_2$, $SiO_2$ |
| 218 | AlN | WSi | $WO_2$, $TiO_2$ | $WO_2$, $B_2O_3$, $SiO_2$ |
| 219 | Mullite | LaSi | $La_2O_3$, $SiO_3$ | $La_2O_3$, $B_2O_3$, $SiO_3$ |
| 220 | Sialon | HfSi | $HfO_2$, $Y_2O_3$ | $HfO_2$, $B_2O_3$, $SiO_3$ |
| 221 | C/C composite | TaSi | $ZrO_2$ + $TaO_2$ | $TaO_2$, $B_2O_3$, $SiO_2$ |
| 222 | $Si_2N_2O$ | $FeSi_2$ | $ZrO_2$, $SiO_2$ | $Fe_2O_3$, $SiO_2$ |
| 223 | Sialon + $ZrO_2$ | AlSi | $Al_2O_3$, MgO | $Al_2O_3$, $B_2O_3$, $SiO_2$ |
| 224 | Sialon + TiN | ZrSi | Zircon | $ZrO_2$, $SiO_2$ |
| 225 | Sialon + SiC | $ZrB_2$ + ZrSi | $ZrO_2$, $Al_2O_3$ | $ZrO_2$, $B_2O_3$, $SiO_2$ |
| 226 | $Si_3N_4$ + TiN | $TiB_2$ + ZrSi | $ZrO_2$ | $TiO_2$, $ZrO_2$, $B_2O_3$, $SiO_2$ |
| 227 | $Si_3N_4$ + Mo | $AlB_2$ | $Al_2O_3$, $Y_2O_3$ | $Al_2O_3$, $B_2O_3$ |
| 228 | $Si_3N_4$ + WC | TiSi | $TiO_2$, $Al_2O_3$ | $TiO_2$, $B_2O_3$, $SiO_2$ |

EXAMPLES 229–244

The surface of each structure shown in Table 12 was covered with each self-recoverable layer shown in Table 12 to a thickness of 200 µm, and each outermost surface layer such as $ZrO_2$ shown in Table 12 to a thickness of 200 µm by a powder type plasma spraying. The plasma spraying was performed by a method wherein plasma was generated using argon gas in a vacuum atmosphere. The self-recoverable layer and the outermost layer thus obtained were dense with a porosity of 3% or less. A crack having a width of 0.2 mm and a depth of 200 µm was given on the outermost surface of the structure. The structure was then kept for 100 hr. in the atmospheric air at 1500° C. As a result, the cracked portion was recovered by a product material generated by the reaction between the self-recoverable layer and oxygen in the atmospheric air at 1500 degrees C. Each component of the recovered portion was shown in Table 12.

TABLE 12

| No. | Structure | Self-Recoverable Layer | Outermost Surface Layer | Recovered Product |
|---|---|---|---|---|
| 229 | Stainless steel | ZrSi | $ZrO_2$ | $ZrO_2$, $SiO_2$ |
| 230 | Cast iron | TiSi | $TiO_2$, $ZrO_2$ | $TiO_2$, $SiO_2$ |
| 231 | $Nb_3Al$ | MoSi | $ZrO_2$, $SiO_2$ | $MoO$, $SiO_2$ |
| 232 | Ni alloy | FeSi | $ZrO_2$, $Fe_2O_3$ | $Fe_2O_3$, $SiO_2$ |
| 233 | Cr alloy | CoSi | $CoO_2$, $ZrO_2$ | $CoO_2$, $SiO_2$ |
| 234 | Carbon steel | LaSi | $La_2O_3$, $ZrO_2$ | $La_2O_3$, $SiO_2$ |
| 235 | Cr—Ni alloy | HfSi | $HfO_2$, $ZrO_2$ | $HfO_2$, $SiO_2$ |
| 236 | Tool steel | TaSi | $Ta_2O_5$, $ZrO_2$ | $TiO_5$, $SiO_2$ |
| 237 | Al alloy | NbSi | $Nb_2O_5$, $ZrO_2$ | $Nb_2O_5$, $SiO_2$ |
| 238 | Ti alloy | AlSi | $Al_2O_3$, $ZrO_2$ | $Al_2O_3$, $SiO_2$ |
| 239 | $Ni_3$(Al, Ti) | NiSi | $NiO_2$, $ZrO_2$ | $NiO_2$, $SiO_2$ |

TABLE 12-continued

| No. | Structure | Self-Recoverable Layer | Outermost Surface Layer | Recovered Product |
|---|---|---|---|---|
| 240 | Inconel | $ZrB_2$ + ZrSi | $ZrO_2$ | $ZrO_2$, $B_2O_3$, $SiO_2$ |
| 241 | Fiber-reinforced Al | ZrSi + MoSi | $ZrO_2$ | $ZrO_2$, $SiO_2$, MoO |
| 242 | One-way eutectic alloy Cr—TaC | ZrSi | $ZrO_2$ | $ZrO_2$, $SiO_2$, $B_2O_3$ |
| 243 | Free-cutting steel | AlSi | $Al_2O_3$ | $Al_2O_3$, $SiO_2$ |
| 244 | SiC particle dispersion-strengthened Ti metal | NiSi | $NiO_2$, $ZrO_2$ | $NiO_2$, $SiO_2$ |

EXAMPLE 245

Figure 3:
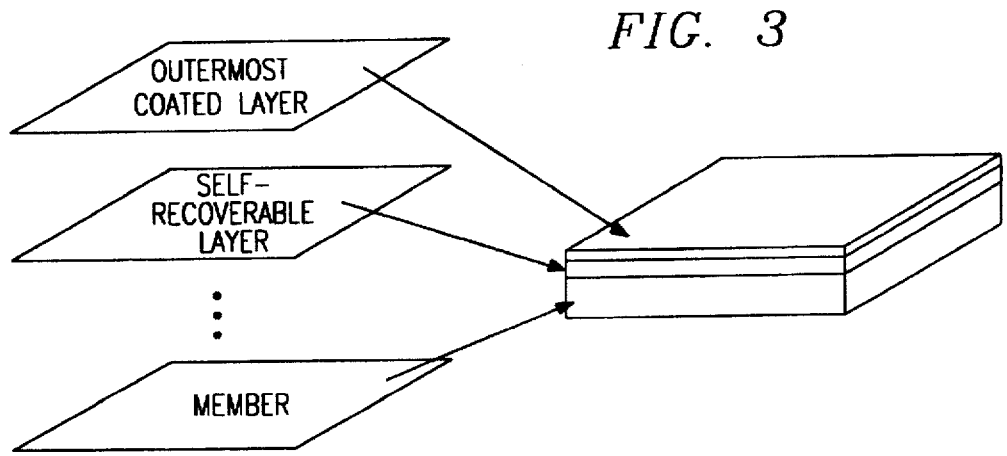
FIG. 3 is a three-dimensional view showing the construction of a self-recoverable layer by a laminating method according to a further example of the present invention.

The ceramic structures, self-recoverable layers, and outermost surface layers having the compositions shown in Examples 1 to 84, 156 to 158, and 162 were fabricated by a laminating method. A ceramic powder as a source of a structure having an average particle size of 0.5 µm was dry-mixed by a mill (automatic mixer). The mixed powder was added with a specified amount of an organic solvent, being formed in a slurry, and was formed into a green sheet by a doctor blade method. Similarly, a ceramic source for a self-recoverable layer was formed into a green sheet by the doctor blade method. Moreover, a ceramic source for an outermost surface layer was formed into a green sheet by the doctor blade method. These green sheets were laminated, and then compressed with a pressure of 98 MPa in the laminating direction into a compact. The compact thus obtained was heated in an inert gas at a temperature ranging from 1400° to 2100° C. until it was densified, thus fabricating a structure covered with the self-recoverable layer (FIG. 3). A crack having a width of 0.3 mm was given on the outermost surface of the structure up to a depth of the self-recoverable layer. The structure was then kept for 100 hr. in the atmospheric air at 1500° C. As a result, the cracked portion was recovered by a product material generated by the reaction between the self-recoverable layer and oxygen in the atmospheric air at 1500° C.

EXAMPLE 246

The self-recoverable layers and the outermost surface layers shown in Examples 1 to 132 were covered by a CVD (Chemical Vapor Deposition) process. For example, a structure was disposed in a reaction chamber, and a titanium halide gas and a boron halide gas were introduced in the reaction chamber at 1000° C., to thus cover the surface of the structure with $TiB_2$. Similarly, by changing the component of an introduced gas and the temperature of the reaction chamber, it is possible to cover the surface of the structure with the layer having each composition shown in the above-described examples. The covering layer thus obtained was dense with a porosity of 5% or less. A crack having a width of 0.3 mm was given on the outermost surface of the structure up to a depth of the self-recoverable layer. The structure was then kept for 1000 hr. in the atmospheric air at 1200° C. As a result, the cracked portion was recovered by a product material generated by the reaction between the self-recoverable layer and oxygen in the atmospheric air at 1500 degrees C.

From this example, it is revealed that the self-recovering function of the present invention is not affected by the covering method. The covering methods include, other than the laminating method, the conventional known methods such as a covering method, printing method, PVD process, CVD process, electrophoresis method, and spraying method. The detail of the covering method is shown, for example, in "Ceramic Covering Technique" issued by General Technical Center.

EXAMPLES 247-254

To examine what effect the thickness of a covering layer exerts on the self-recovering function, tests were made for the structures shown in Example 1. The result is shown in Table 13. As is apparent from Table 13, the thickness of the self-recoverable layer is required to be at least 1/10 that of the outermost surface covering layer for sufficiently achieving the self-recovering function.

TABLE 13

| No. | Structure | Thickness of Self-Recoverable Layer | Thickness of Outermost Surface Layer | Recovered Product |
|---|---|---|---|---|
| 247 | $Si_3N_4$ | $ZrB_2$(150 μm) | $ZrO_2$(200 μm) | Good |
| 248 | $Si_3N_4$ | $ZrB_2$(100 μm) | $ZrO_2$(200 μm) | Good |
| 249 | $Si_3N_4$ | $ZrB_2$(80 μm) | $ZrO_2$(200 μm) | Good |
| 250 | $Si_3N_4$ | $ZrB_2$(50 μm) | $ZrO_2$(200 μm) | Good |
| 251 | $Si_3N_4$ | $ZrB_2$(40 μm) | $ZrO_2$(200 μm) | Good |
| 252 | $Si_3N_4$ | $ZrB_2$(20 μm) | $ZrO_2$(200 μm) | Good |
| 253 | $Si_3N_4$ | $ZrB_2$(10 μm) | $ZrO_2$(200 μm) | Unusable for a long time |
| 254 | $Si_3N_4$ | $ZrB_2$(5 μm) | $ZrO_2$(200 μm) | Unusable for a long time |

EXAMPLE 255

Figure 4:
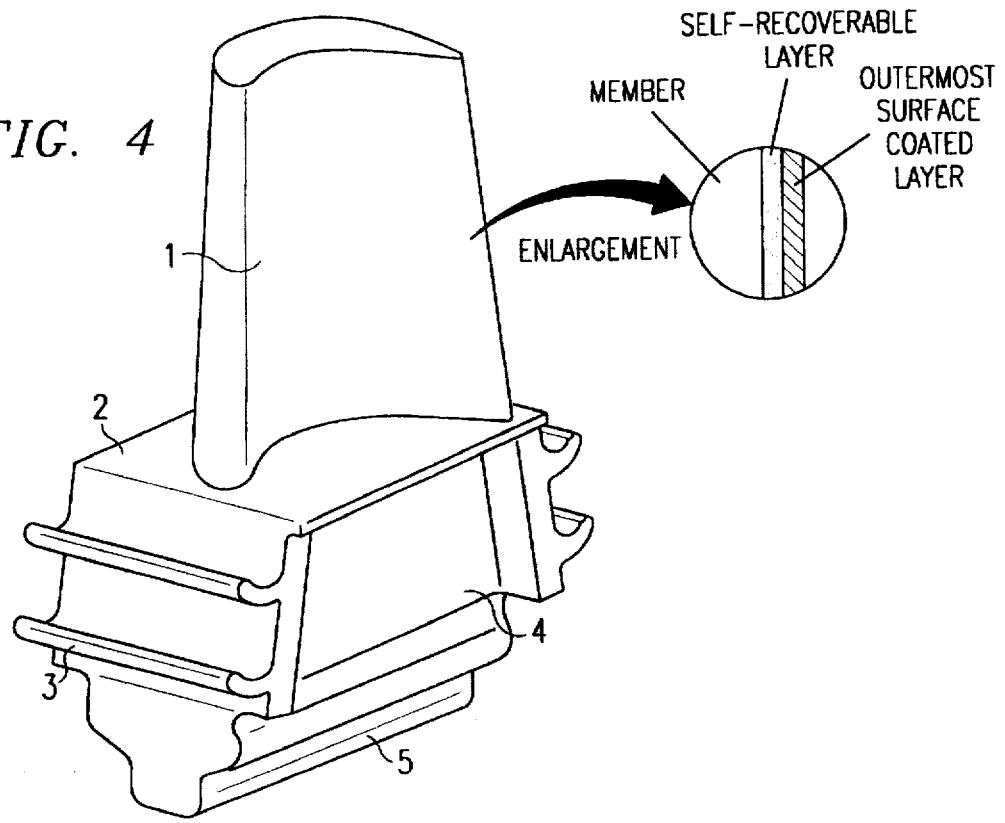
FIG. 4 is a view showing the appearance of a ceramic gas turbine moving blade to which the present invention is applied.
Figure 5:
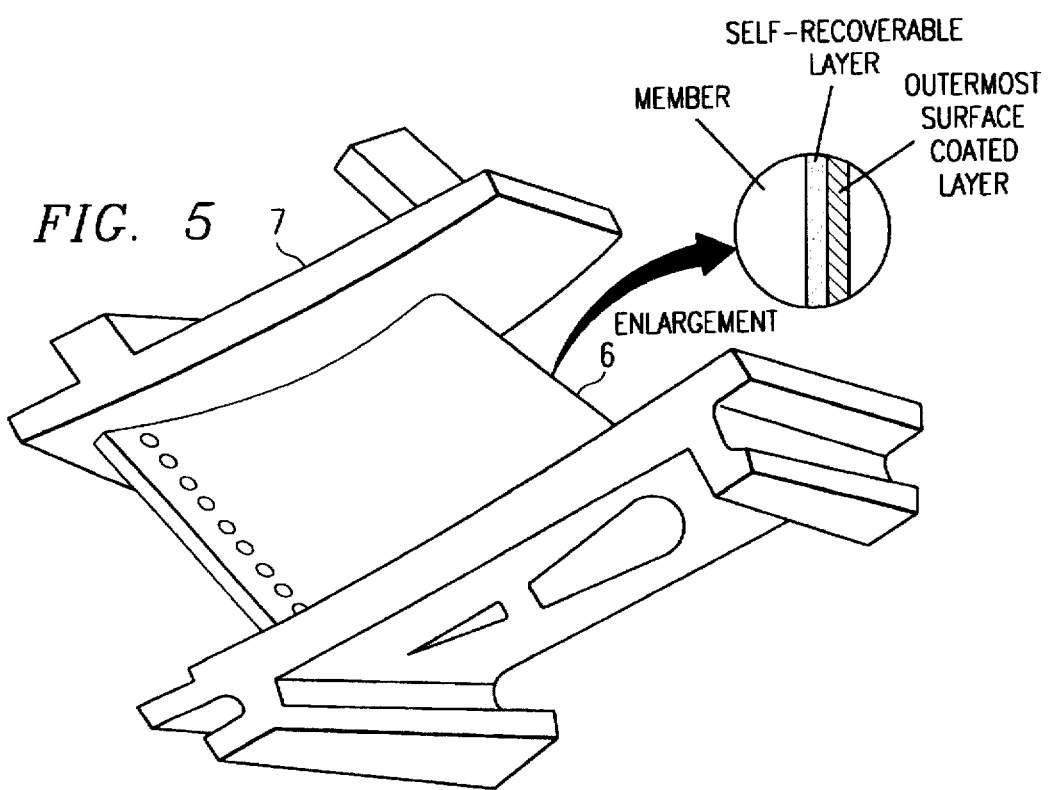
FIG. 5 is a view showing the appearance of a ceramic gas turbine stator blade to which the present invention is applied.

A moving blade and a stator blade for a gas turbine shown in FIGS. 4 and 5 were fabricated using the members obtained in Examples 1, 16, 85, and 156 to 163. A gas turbine of a class of 1500° C., which was incorporated with the member, was operated; and periodically stopped to examine the state of surface damage. There was no abnormality until 1000 hr, and cracks were generated after 2000 hr; however, the cracked portion was self-recovered by a compound produced from the self-recoverable layer. Even after 5000 hr, the cracks were buried by the self-recoverable layer, thereby preventing the oxidization of the structure as the base material.

EXAMPLE 256

Figure 6:
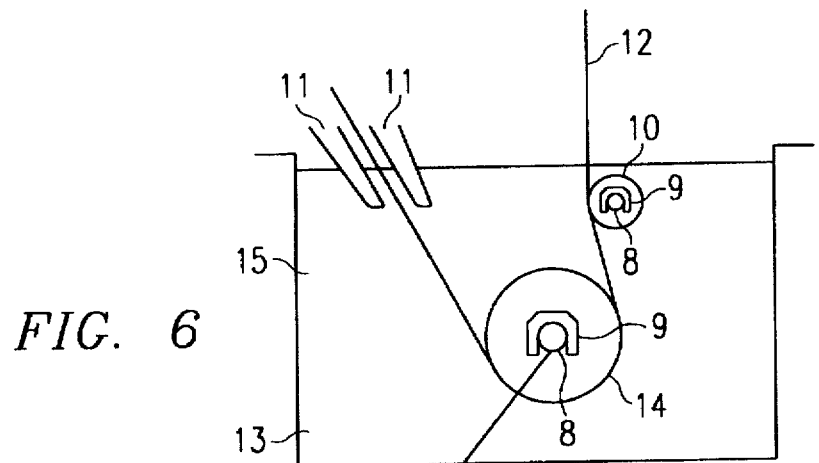
FIG. 6 is a schematic view of a continuous hot dip metal plating apparatus to which the present invention is applied.

A structural member, in which the surface of a $Si_3N_4$ structure was covered with $AlB_2$ as a self-recoverable layer and sialon was covered on the outermost surface, was applied to a roll shaft used for continuous hot dip zinc plating. FIG. 6 shows a continuous hot dip zinc plating apparatus. The member was used for a roll shaft 8 and a support roll 10 in FIG. 6. A C/C composite was used for a bearing 9. The apparatus in this example was used for continuous plating in a zinc bath at 500° C. The sialon layer was worn after 1000 hr; however, the damaged portion was recovered by the intermetalic compound of Al—Zn produced by the reaction between $AlB_2$ as the self-recoverable layer and zinc.

The service life of a conventional steel roll shaft and bearing due to wear was three days. However, the member in this embodiment did not suffer from abnormal wear even after continuous operation for three months or more, contributing to the uniform plating work.

As shown in this example, a product material generated by the reaction between molten metal in a service environment and a self-recoverable layer can achieve the recovering function.

EXAMPLE 257

A structural member, in which the surface of a $Si_3N_4$ structure was covered with $NbB_2$ as a self-recoverable layer and sialon was covered on the outermost surface, was applied to a roll shaft for continuous hot dip aluminum plating. The member was used for a roll shaft 8 and a support roll 10 in FIG. 6. A C/C composite was used for a bearing 9. The apparatus in this example was used for continuous plating in an aluminum bath at 680° C. The sialon layer was worn after 1000 hr; however, the damaged portion was recovered by the intermetalic compound of Nb—Al produced by the reaction between $NbB_2$ as the self-recoverable layer and aluminum. The service life of a conventional steel roll shaft and bearing was four days. However, the member in this embodiment did not suffer from abnormal wear even after continuous operation for three months or more, contributing to the uniform plating work.

EXAMPLE 258

A metal Si powder having an average particle size of 1 μm (100 parts by weight) was added with a mixture of polyethylene, stearic acid and synthetic wax (13 parts by weight), and then kneaded, to form a source as a ceramic part. The source was extruded into a plate having a size of 100×100×10 mm by an extruder. A bundle (diameter: 1.5 mm) of carbon fibers (diameter: 10 μm, length: 1000 μm) was molded on this plate, to form a resistance measuring circuit for life diagnosis.

The compact was heated up to 1350° C. with a temperature rising rate of 1° C./min, and cooled in a furnace, to obtain a $Si_3N_4$ reaction-sintered ceramic having a resistance measuring circuit for life diagnosis. The degreasing for a binder was performed in the temperature rising process. The surface layer portion of the reaction-sintered ceramic thus obtained was covered with $ZrB_2$ as a self-recoverable layer to a thickness of 200 μm by plasma spraying. A dense film of $ZrO_2$ was formed thereon to a thickness of 200 μm for ensuring the heat resistance by plasma spraying. In the reaction-sintered body, since the surface layer portion was porous and $ZrB_2$ was produced in voids, a film with a high bonding strength could be obtained. A copper wiring was brazed to the end portion of the inner circuit, which was connected to an external measuring apparatus.

Figure 7:
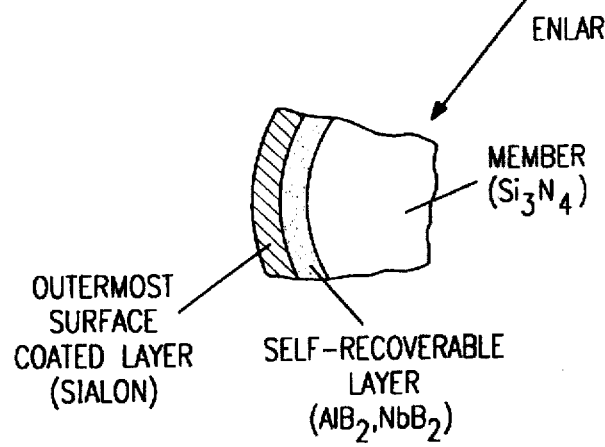
FIG. 7 is a view showing the appearance of a tile for combustor to which the present invention is applied, and also showing the concept of a life diagnostic function.
Figure 7:
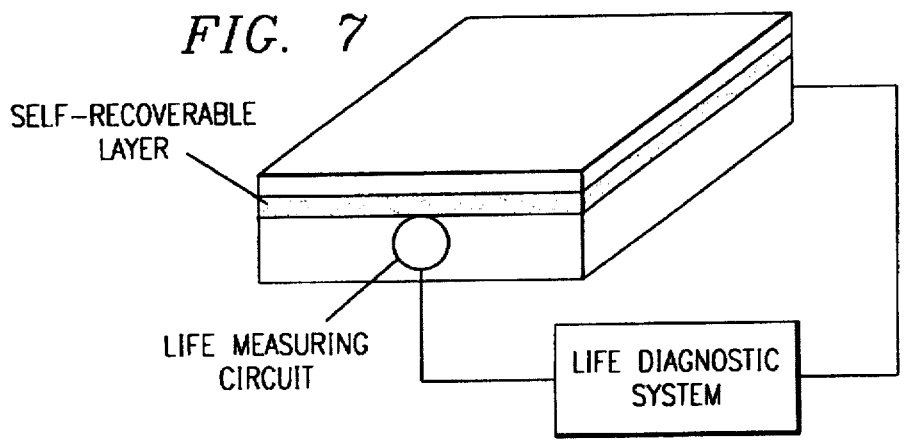

The ceramic part was applied to a lining part in a combustor for a 1500° C. class gas turbine. As a result, in the ceramic part, when the $ZrO_2$ film was broken by a combustion test, $ZrB_2$ was simultaneously oxidized to recover the $ZrO_2$ film. At the same time, the resistance of the resistance measuring circuit for life diagnosis changed. The changed resistance was compared with a threshold for performing life diagnosis for the lining part in the combustor (FIG. 7).

Similarly, a complex ceramic ($Si_3N_4/Si_2N_2O$, $Si_3N_4/AlN$, $Si_3N_4/Al_2O_3$, $Si_3N_4/ZrO_2$, $Si_3N_4/mullite$, $Si_3N_4/SiC$ or the like) having a resistance measuring circuit for life diagnosis was fabricated by the reaction sintering method using the above Si powder mixed with powders or whiskers of $Si_3N_4$, $Si_2N_2O$, AlN, $Al_2O_3$, $ZrO_2$, $B_4C$, BN, mullite and the like. The complex ceramic thus obtained was applied to the lining part in the combustor, which gave the same result as the above-described ceramic part, that is, which achieved the life diagnosis by the excellent self-recovering function.

The formation of the ceramics used in the present invention may be performed by methods of doctor blade, die compacting, CIP, injecting molding, slip-casting, extrusion and the like according to the shapes of the parts.

As the binder for molding the above-described green sheet, there may be used known binders for molding ceramics, which include high polymer materials such as polyvinyl butyryl and polyethylene, silicone-family compounds, and polysilane-family compounds. The degreasing method for these binders is not limited, but it is preferably performed by controlling the temperature rising rate during sintering.

EXAMPLE 259

Powders of $ZrO_2$ (50 parts by weight), $SiO_2$ (30 parts by weight), $Al_2O_3$ (20 parts by weight) were mixed with triethanol amine (1 part by weight) and distilled water (65 parts by weight), to form a source for a ceramic part. Using the source thus obtained, there were fabricated, by slip casting, a tonguedish for molten metal, a refractory for mold inlet, and a mold. In molding, a bundle of carbon fibers (diameter: 100 μm, length: 50 cm, number: 100) were inserted in each member, to form a resistance measuring circuit for life diagnosis.

The above molded product was heated up to 1650° C. with a temperature rising rate of 5° C./min in an oxidizing atmosphere, being kept for 2 hr, and was cooled in a furnace, thus obtaining a ceramic having a resistance measuring circuit for life diagnosis. The degreasing for a binder was performed in the temperature rising process. The end portion of the life diagnosis circuit was connected to an external circuit by way of a copper wiring. Moreover, the life diagnosis circuit was insulated by an $Al_2O_3$ protecting tube. The surface layer portion of the ceramic thus obtained was covered with $LaB_2$ as a self-recoverable layer by plasma spraying, and a dense film of sialon was formed thereon to a thickness of 200 μm for ensuring a heat resistance by plasma spraying.

The ceramic parts were applied to an aluminum continuous casting machine. As a result of the testing, when each ceramic part was worn out and cracked, the cracked portion was recovered by a LaAl layer and simultaneously the resistance was changed. The change in the resistance was detected, to give the life of the part to an operator. This makes it possible to effectively perform the maintenance of the continuous casting machine.

EXAMPLE 260

An outer wall tile and nose cone for a space shuttle were fabricated using the inventive members obtained in Examples. 85, 94 and 95. The members were subjected to a burner test at 2000° C., and the equipment was periodically stopped to examine the damaged state on the surface. There was no abnormality until 50 hr, and cracks were generated at the $ZrO_2$ layer after 100 hr; however, the cracked portion was recovered by a product material generated from the self-recoverable layer, thus preventing the oxidization of the structure as the base material.

EXAMPLE 261

Using oxides produced from the self-recoverable layers, other than those shown in the above-described examples, have also the self-recovering function. For example, when the oxides shown in Table 14 were used in environments having temperature lower than the melting points thereof, there could be obtained the stable recovered portions. In particular, a $Al_2O_3$ system and MgO system are stable. As the self-recoverable layers, borides and silicates capable of producing the compounds shown in Table 14 by oxidization may be selected.

TABLE 14

| Recovered Product from Self-Recoverable Layer and Melting Point (°C.) | | Recovered Product from Self-Recoverable Layer and Melting Point (°C.) | |
|---|---|---|---|
| $Al_2O_3$—BaO | 1425 | $Li_2O$—$Al_2O_3$—$SiO_2$ | 1400 |
| $Al_2O_3$—BeO | 1835 | $K_2O$—$Al_2O_3$—$SiO_2$ | 1686 |
| $Al_2O_3$—CaO | 1400 | MgO—$Al_2O_3$—$SiO_2$ | 1470 |
| $Al_2O_3$—$CeO_2$ | 1800 | CaO—$Al_2O_3$—$SiO_2$ | 1553 |
| $Al_2O_3$—FeO | 1310 | BaO—$Al_2O_3$—$SiO_2$ | 1750 |
| $Al_2O_3$—MgO | 1995 | FeO—$Al_2O_3$—$SiO_2$ | 1560 |
| $Al_2O_3$—MnO | 1520 | CaO—MgO—$SiO_2$ | 1500 |
| $Al_2O_3$—$Na_2O$ | 1410 | CaO—$TiO_2$—$SiO_2$ | 1352 |
| $Al_2O_3$—$SiO_2$ | 1595 | BaO—$TiO_2$—$SiO_2$ | 1400 |
| $Al_2O_3$—$TiO_2$ | 1705 | CaO—$ZrO_2$—$SiO_2$ | 1453 |
| $Al_2O_3$—ZnO | 1700 | β-Spodumene | 1000 |
| $Al_2O_3$—$ZrO_2$ | 1885 | Barium Osumilite | 1250 |
| MgO—CaO | 2370 | Mullite | 1500 |
| MgO—$SiO_2$ | 1543 | Hexacelsian | 1700 |
| MgO—$TiO_2$ | 1583 | MgO—$GeO_2$ | 1099 |
| MgO—$ZrO_2$ | 1500 | $ZrO_2$—$SiO_2$ | 1687 |
| $ZrO_2$—$TiO_2$ | 1760 | $ZrO_2$—$Nb_2O_5$ | 1430 |
| $SiO_2$—BaO | 1370 | $SiO_2$—CaO | 1436 |
| $SiO_2$—SrO | 1358 | $SiO_2$—$TiO_2$ | 1550 |
| $SiO_2$—ZnO | 1432 | $TiO_2$—BaO | 1317 |

Moreover, the compounds shown in Table 14 may be used as they are. In this case, the environmental temperature must be lower than the melting points of the self-recoverable layers.

A barrier may be inserted between the surface of a structure of a ceramic or C/C composite and a self-recoverable layer, as needed.

According to further embodiments of the invention the self-recoverable layer of the present invention can be formed into a complex shape, and therefore, it is easily applied to parts required for high reliability (for example, engine parts, parts for a continuous metal plating apparatus, first wall parts of a nuclear fusion reactor in an atomic power plant, moving blade and stator blade of a gas turbine, parts for combustor, shroud parts and the like).

What is claimed is:

1. A process for making a self-recovering product for use in a reactive environment, said process comprising:

forming a base member comprising at least one kind of ceramics, metals and C/C composites; and forming a self-recovering protective layer substantially isolating said base member and exposed to a reactive environment, wherein said self-recovering protective layer comprises:

an outer layer of protective material comprising an oxide compound resistive to the reactive environment; and an inner layer of protective material, located between the base member and the outer layer of protective material, said inner layer comprising a reactive material including a boride selected from the group consisting of Aluminum, Hafnium, Tantalum, Yttrium and Zirconium, wherein said reactive material is present in quantities sufficient to substantially reisolate the base member, by means of reaction between the reactive material and the reactive environment, when the reactive material is exposed to the reactive environment through an opening in the outer layer of protective material.

2. A process as in claim 1 wherein a difference in a thermal expansion coefficient between said reactive material and said protective material is within a range of $4 \times 10^{-6}/°C$ or less.

3. A process as in claim 1 wherein said self-recovering protective layer comprises a distribution of a protective material and a reactive material, wherein said protective material is in higher concentrations near the reactive environment and said reactive material is in higher concentrations near the base member.

4. A process as in claim 1 wherein said self-recovering protective layer comprises an even distribution of said protective material and said reactive material.

5. A process as in claim 1 wherein said inner layer of protective material comprises a silicate selected from the group consisting of Aluminum, Hafnium, Tantalum, Yttrium and Zirconium.

6. A process as in claim 1 wherein said reactive material comprises a tantalum compound.

7. A process as in claim 1 wherein said protective material has a vapor pressure of $1 \times 10^{-4} N/m^2$ or less in the atmospheric air at 1500° C.

8. A process as in claim 7 wherein said protective material comprises a zirconium compound.

9. A process as in claim 7 wherein said protective material comprises an aluminum compound.

10. A process as in claim 7 wherein said protective material comprises an yttrium compound.

11. A process as in claim 7 wherein said protective material comprises a tantalum compound.

12. A process as in claim 7 wherein said protective material comprises a hafnium compound.

13. A process as in claim 1 wherein a difference in a thermal expansion coefficient between said reactive material and said protective material is within a range of $4 \times 10^{-6}/°C$ or less.

14. A process as in claim 1 wherein said reactive material has a vapor pressure of $1 \times 10^{-4} N/m^2$ or less in the atmospheric air at 1500° C.

15. A process as in claim 14 wherein said reactive material comprises a zirconium compound.

16. A process as in claim 14 wherein said reactive material comprises a silicon compound.

17. A process as in claim 14 wherein said reactive material comprises an aluminum compound.

18. A process as in claim 1 wherein said reactive material comprises a silicon compound, said silicon compound further comprising at least one or more elements from a group consisting of a silicate of Zr, Hf, Ta, Al and Y, and which is added in an amount of about 30 vol % or more.

19. A process as in claim 1 wherein said reactive material comprises a boron compound, said boron compound further comprising at least one or more elements from a group consisting of borides of Zr, Hf, Ta, Al and Y, and which is added in an amount of about 30 vol % or more.

20. A process as in claim 1 wherein said protective material comprises an oxide of one or more elements selected from a group consisting of Zr, Hf, Ta, Al and Y.

* * * * *